(12) United States Patent
Scheiner et al.

(10) Patent No.: US 7,123,366 B2
(45) Date of Patent: Oct. 17, 2006

(54) METHOD AND APPARATUS FOR MEASUREMENTS OF PATTERNED STRUCTURES

(75) Inventors: David Scheiner, Ganei Yehuda (IL); Vladimir Machavariani, Rishon Lezion (IL)

(73) Assignee: Nova Measuring Instruments Ltd., Rehovot (IL)

(*) Notice: Subject to any disclaimer, the term of this patent is extended or adjusted under 35 U.S.C. 154(b) by 225 days.

(21) Appl. No.: 10/919,823

(22) Filed: Aug. 17, 2004

(65) Prior Publication Data

US 2005/0062965 A1    Mar. 24, 2005

Related U.S. Application Data

(63) Continuation of application No. 10/011,263, filed on Nov. 13, 2001, now Pat. No. 6,836,324, which is a continuation-in-part of application No. 09/605,664, filed on Jun. 26, 2000, now Pat. No. 6,476,920, which is a continuation-in-part of application No. 09/267,989, filed on Mar. 12, 1999, now Pat. No. 6,100,985, which is a continuation-in-part of application No. 09/092,378, filed on Jun. 5, 1998, now abandoned.

(30) Foreign Application Priority Data

Mar. 18, 1998  (IL)  ........................... 123727

(51) Int. Cl.
    G01B 11/14    (2006.01)
(52) U.S. Cl. ............... 356/625; 356/632; 250/341.1
(58) Field of Classification Search ............... 356/625, 356/601, 630, 632, 635, 639, 319; 250/372, 250/341.1
See application file for complete search history.

(56) References Cited

U.S. PATENT DOCUMENTS

| | | | |
|---|---|---|---|
| 4,555,767 A | 11/1985 | Case et al. |
| 4,740,082 A | 4/1988 | Young |
| 4,899,055 A | 2/1990 | Adams |
| 4,999,014 A | 3/1991 | Gold et al. |
| 4,999,508 A | 3/1991 | Hyakumura |
| 5,087,121 A | 2/1992 | Kakuchi et al. |
| 5,361,137 A | 11/1994 | Aton et al. |

(Continued)

Primary Examiner—Gregory J. Toatley, Jr.
Assistant Examiner—Roy M. Punnoose
(74) Attorney, Agent, or Firm—Greer, Burns & Crain, Ltd.

(57) ABSTRACT

An apparatus and a method are disclosed for measuring at least one desired parameter of a patterned structure having a plurality of features defined by a certain process of its manufacturing, wherein the structure represents a grid having at least one cycle formed of at least two metal-containing regions spaced by substantially transparent regions with respect to incident light defining a waveguide. The method utilizes an optical model based on at least some of the features of the structure defined by a certain process of its manufacturing, and is capable of determining theoretical data representative of photometric intensities of light components of different wavelengths specularly reflected from the structure and of calculating said at least one desired parameter of the structure.

47 Claims, 11 Drawing Sheets

U.S. PATENT DOCUMENTS

| | | |
|---|---|---|
| 5,450,205 A | 9/1995 | Sawin et al. |
| 5,517,312 A | 5/1996 | Finarov |
| 5,571,312 A | 11/1996 | Andoe |
| 5,604,581 A | 2/1997 | Liu et al. |
| 5,702,956 A | 12/1997 | Ying et al. |
| 5,898,500 A | 4/1999 | Canteloup et al. |
| 5,900,633 A | 5/1999 | Solomon et al. |
| 5,946,102 A | 8/1999 | Holcomb |
| 5,959,731 A | 9/1999 | Jones |
| 6,100,985 A | 8/2000 | Scheiner et al. |
| 6,476,920 B1 | 11/2002 | Scheiner et al. |
| 6,657,736 B1 * | 12/2003 | Finarov et al. ............ 356/625 |

* cited by examiner

METHOD AND APPARATUS FOR MEASUREMENTS OF PATTERNED STRUCTURES

This is a continuation of application Ser. No. 10/011,263, filed Nov. 13, 2001 now U.S. Pat. No. 6,836,324, which is a continuation-in-part of application Ser. No. 09/605,664, filed Jun. 26, 2000 now U.S. Pat. No. 6,476,920, which is a continuation-in-part of application Ser. No. 09/267,989, filed Mar. 12, 1999 now U.S. Pat. No. 6,100,985, which is a continuation-in-part of application Ser. No. 09/092,378, filed Jun. 5, 1998 now abandoned.

FIELD OF THE INVENTION

This invention is in the field of measurement techniques and relates to a method and a system for measuring the parameters of patterned structures.

BACKGROUND OF THE INVENTION

Techniques for thickness measurements of patterned structures have been developed The term "patterned structure" used herein, signifies a structure formed with regions having different optical properties with respect to an incident radiation More particularly, a patterned structure represents a grid having one or more cycles, each cycle being formed of at least two different locally adjacent stacks. Each stack is comprised of layers having different optical properties.

Production of integrated circuits on semiconductor wafers requires maintaining tight control over the dimensions of small structures. Certain measuring techniques enable the local dimensions of a wafer to be measured with relatively high resolution, but at the expense of discontinued use of the wafer in production. For example, inspection using a scanning electron microscope gives measurements of the parameters of a patterned structure, but at the expense of cleaving it and thus excluding it from continued processing. Mass production of patterned structures such as wafers requires a non-destructive process for controlling thin film parameters in a manner enabling the local measurements to be performed.

One kind of the conventional techniques for measuring thickness of thin films is disclosed in U.S. Pat. No. 4,999,014. The technique is based on the use of small spot size and large numerical aperture for measurements on small areas. Unfortunately, in the case of a very small structure, this approach suffers from a common drawback associated, on the one hand, with the use of a small spot-size and, on the other hand, owing to the large numerical aperture, with the collection of high diffraction orders. The term "small spot-size" signifies the spot diameter similar in size to the line or space width of the measured structure, i.e. a single grid cycle. This leads to various problems, which are difficult to solve. Indeed, not all the stacks' layers are in the focus of an optical system used for collecting reflected light, the optical system being bulky and complicated. Detected signals are sensitive to small details of a grid profile and to small deviations in the spot placement. Diffraction effects, which depend significantly on the grid profile and topography and therefore are difficult to model, have to be included in calculations.

Another example of the conventional techniques of the kind specified is disclosed in U.S. Pat. No. 5,361,137 and relates to a method and an apparatus for measuring the submicron linewidths of a patterned structure. The measurements are performed on a so-called "test pattern" in the form of a diffraction grating, which is placed in a test area of the wafer. Here, as in most conventional systems, a monochromatic incident light is employed and diffraction patterns are produced and analyzed. However, a large number of test areas are used and also information on multiple parameters cannot be obtained.

According to some conventional techniques, for example that disclosed in U.S. Pat. No. 5,087,121, portions with and without trenches are separately illuminated with broadband light, the reflection spectrum is measured and corresponding results are compared to each other with the result being the height or depth of a structure. However, it is often the case that the structure under inspection is such that the different portions cannot be separately imaged. This is owing to an unavoidable limitation associated with the diameter of a beam of incident radiation striking the structure.

The above approach utilizes frequency filtering to enable separation of interference signals from different layers. This is not feasible for layers of small thickness and small thickness difference because of a limited number of reflection oscillations.

Yet another example of the conventional technique for implementing depth measurements is disclosed in U.S. Pat. No. 5,702,956. The method is based on the use of a test site that represents a patterned structure similar to that of the wafer (circuit site), but taken in an enlarged scale. The test site is in the form of a plurality of test areas each located in the space between two locally adjacent circuit areas. The test areas are designed so as to be large enough to have a trench depth measured by an in-line measuring tool. The measurements are performed by comparing the parameters of different test areas assuming that the process is independent of feature size. For many processes in the field such as etching and photoresist development, this assumption is incorrect and this method is therefor inapplicable.

SUMMARY OF THE INVENTION

It is a major object of the present invention to overcome the above listed and other disadvantages of the conventional techniques and provide a novel method and system for non-destructive, non-contact measurements of the parameters of patterned structures.

It is a further object of the invention to provide such a method and system that enables the relatively small amount of information representative of the structure's conditions to be obtained and successfully processed for carrying out the measurements, even of very complicated structures.

According to one aspect of the present invention, there is provided a method for measuring at least one desired parameter of a patterned structure, which represents a grid having at least one cycle formed of at least two metal-containing regions spaced by substantially transparent regions with respect to incident light thereby defining a waveguide, the structure having a plurality of features defined by a certain process of its manufacturing, the method comprising the steps of:

(a) providing an optical model, which is based on at least some of said features of the structure, on relation between a wavelength range of the incident light to be used for measurements and a space size between the two metal-containing regions in the grid cycle, and a skin depth of said metal, and is capable of determining theoretical data representative of photometric intensities of light components of different wavelengths specularly reflected from the structure and of calculating said at least one desired parameter of the structure;

(b) locating a measurement area for applying thereto spectrophotometric measurements, wherein said measurement area is a grid cycles containing area;

(c) applying the spectrophotometic measurements to said measurement area by illuminating it with incident light of a preset substantially wide wavelength range, detecting light component substantially specularly reflected from the measurement area, and obtaining measured data representative of photometric intensities of each wavelength within siad wavelength range;

(d) analyzing the measured data and the theoretical data and optimizing said optical model until said theoretical data satisfies a predetermined condition; and (e) upon detecting that the predetermined condition is satisfied, calculating said at least one parameter of the structure.

Thus, the present invention utilizes the features of a patterned structure, whose parameters are to be measured, which are defined by manufacturing steps of a certain technological process completed prior to the measurements, and a relation between the wavelength range of incident light used for measurements and a space size between the two metal-containing regions in the grid cycle, and a skin depth of the metal. Actual design-rule features can often be found in the structure in sets (e.g. read lines in memories). The term "design-rule features" signifies a predetmined set of the allowed pattern dimensions used throughout the wafer. Hence, information regarding the desired parameters can be obtained using super-micron tools such as a large spot focused on a set of lines.

The present invention, as distinct from the conventional approach, utilizes a spectrophotometer that receives reflected light substantially from zero-order. The zero-order signal is not sensitive to small details of the grid profile of the structure such as edge rounding or local slopes. This enables the effects associated with diffracted light not to be considered, and thereby the optical model, as well as the optical system, to be simplified.

In the case of wafers, each element in the grid cycle consists of a stack of different layers. The features of such a structure (wafer), which are dictated by the manufacturing process and should be considered by the optical model, may be representative of the following known effects:

specular reflection from the different stacks within the grid cycle;

interference of reflected light from layers within each stack;

dissipation within transparent stacks due to cavity-like geometry formed in the grid-like structure;

specular contributions due to width of stacks relative to the wavelength;

polarization due to the incident beam interaction with a conductive grid-like structure, if present;

effects due to limited coherence of illumination, interference between light beams reflected from each stack within the grid cycle, taking into account the above effects.

The contribution of each of the above effects into the theoretical data are estimated in accordance with the known physical laws.

The optical model, being based on some of the features, actually requires certain optical model factors to be considered in order to perform precise calculations of the desired parameters. If information of all the features is not available and the model cannot be optimized prior to the measurements, this is done by means of a so-called initial Gleaming step. More specifically, there are some optical model factors which, on the one hand, depend variably on all the features and, on the other hand, define the contribution of each of the existing optical effects into the detected signal. The values of these optical model factors are adjusted along with the unknown desired parameters during the learning step so as to satisfy the predetermined condition. The latter is typically in the form of a merit function defining a so-called "goodness of fit" between the measured and theoretical data. The resulting optical model factors can consequently be used in conjunction with known features to enable precise calculations of the desired parameters of the structure.

Preferably, the measurement area is the part of the structure to be measured. Alternatively, the measurement area is located on a test pattern representative of the actual structure to be measured, namely having the same design rules and layer stacks. The need for such a test pattern may be caused by one of the following two reasons:

1) If the measurement area is not substantially smaller than the available surface area defined by the actual structure to be measured, then the test site is implemented so as to include an extended structure;

2) If the structure is very complicated or consists of ambiguous under-layer structure, then the test site is implemented with the same geometry as that of the actual structure to be measured, but with a simplified under-layer design thus allowing simplified measurements of the top layers.

According to another aspect of the present invention, there is provided an apparatus for measuring at least one desired parameter of a patterned structure that represents a grid having at least one grid cycle formed of at least two metal-containing regions spaced by substantially transparent regions with respect to incident light defining a waveguide, the structure having a plurality of features defined by a certain process of its manufacturing, the apparatus comprising:

a spectrophotometer illuminating a measurement area by incident light of a preset substantially wide wavelength range and detecting a specular reflection light component of light reflected from the measurement area for providing measured data representative of photometric intensities of detected light within said wavelength range; and a processor unit coupled to the spectrophotometer, the processor unit comprising a pattern recognition software and a translation means so as to be responsive to said measured data and locate measurements, the processor being operable for applying an optical model based on at least some of said features of the structure, on relation between wavelength range of the incident light to be used for measurements and a space size between the two metal-containing regions in the grid cycle, and a skin depth of said metal, for providing theoretical data representative of photometric intensities of light specularly reflected from the structure within said wavelength range and calculating said at least one desired parameter, and comparing said measured and theoretical data and detecting whether the theoretical data satisfies a predetermined condition.

Preferably, the spectrophotometer is provided with an aperture stop accommodated in the optical path of the specular reflected light component. The diameter of the aperture stop is set automatically according to the grid cycle of the measured structure.

Preferably, the incident radiation and the reflected light received by the detector are directed along substantially specular reflection axes.

More particularly, the invention is concerned with measuring height/depth and width dimensions on semiconductor wafers and is therefore described below with respect to this application.

BRIEF DESCRIPTION OF THE DRAWINGS

In order to understand the invention and to see how it many be carried out in practice, a preferred embodiment will now be described, by way of non-limiting example only, with reference to the accompanying drawings, in which:

FIGS. 13A–13C illustrate a two-dimensional structure to be measured, relating to DRAM applications, wherein FIG. 13A is a top view of the structure, and FIGS. 13B and 13C are cross-sectional views taken along lines A—A and B—B, respectively, in FIG. 13A.

DETAILED DESCRIPTION OF A PREFERRED EMBODIMENT

Figure 1A:
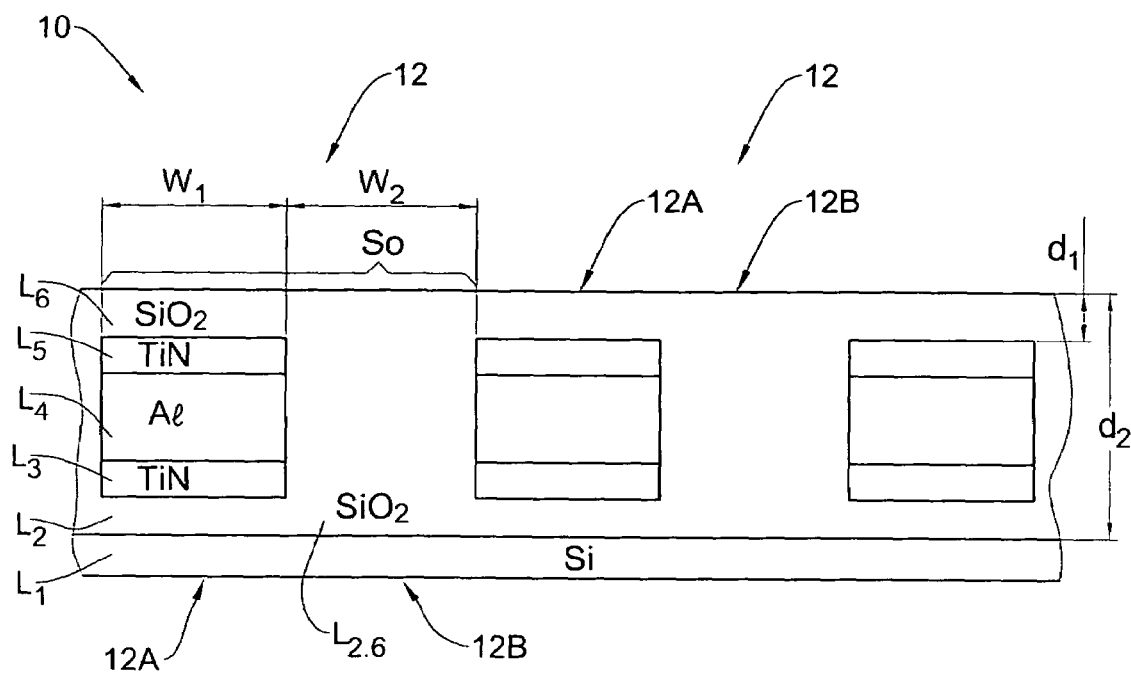
FIGS. 1a and 1b are, respectively, schematic cross-sectional and top views of one kind of a patterned structure to be measured.
Figure 1B:
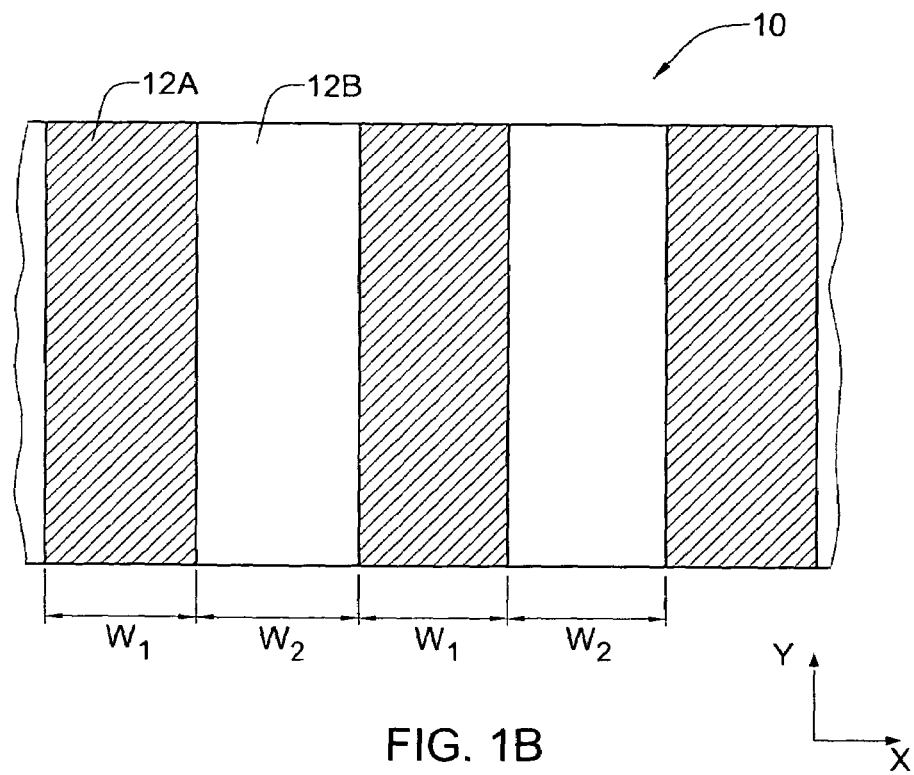

Referring to FIGS. 1a and 1b, there are partly illustrated a cross-section and a top view, respectively, of a grid-like wafer structure, generally designated 10, whose parameters are to be measured. The structure is formed of a plurality of cells, generally at 12, each constituting a grid cycle. Only three adjacent cells 12 are demonstrated in the present example with only two stacks (or elements) in each cell in order to simplify the illustration. Thus, the cell 12 comprises two stacks 12a and 12b formed of different layers. More specifically, the stack 12a includes six layers $L_1$–$L_6$, wherein the layers $L_1$ and $L_2$ and the layer $L_6$ form two layers $L_1$ and $L_{2,6}$, respectively, of the stack 12b. As known in the conventional semiconductor devices, semiconductor structures such as sources, drains and gate electrodes, capacitors, etc. are formed in and on a semiconductor substrate (layer $L_1$) typically made of silicon material and including meal conductors (e.g. aluminum). The substrate is coated by an insulating silicon oxide compound (layer $T_2$). The first level metal layer $L_4$ (and the single level in the present example) is formed, being interposed between top and bottom barrier layer $L_3$ and $L_5$ made of titanium nitride (TiN). Deposition coat of an uppermost insulating silicon oxide layer $L_6$ and subsequent chemical mechanical polishing (CMP), consisting of thinning the uppermost layer $L_6$, completes the manufacturing. The construction of such a structure and method of its manufacturing are known per se and therefore need not be more specifically described.

According to this specific example, the parameters to be measured are the widths $W_1$ and $W_2$ of the stacks 12a and 12b and depths $d_1$ and $d_2$ of the uppermost silicon oxide layers $L_6$ and $L_{2,6}$, respectively. It is appreciated that any other parameters of the patterned structure such as, for example, materials and their optical properties, can be measured.

Figure 2:
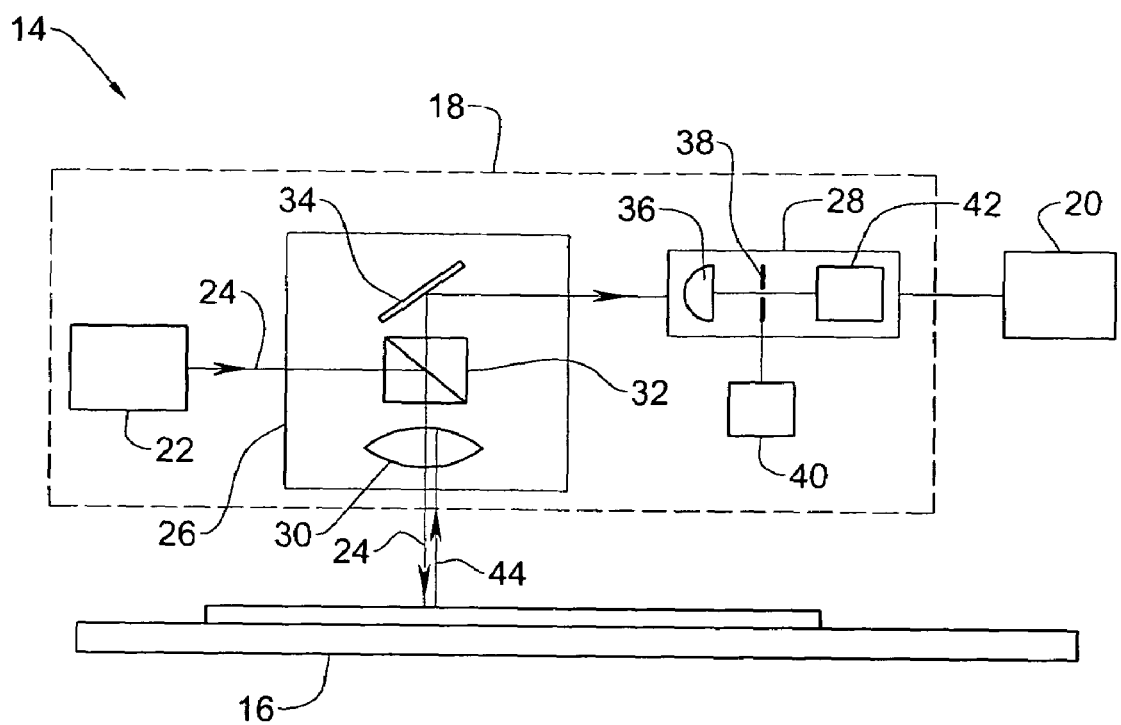
FIG. 2 schematically illustrates the main components of an apparatus according to the invention for measuring the parameters of a patterned structure.

Reference is now made to FIG. 2 illustrating a system, generally designated 14, suitable for carrying out the measurements. The system 14 may represent one of the working stations of a production line (not shown), the wafers 10 progressing between upstream and downstream stations of the production line. The system 14 comprises a support frame 16 for holding the structure 10 within an inspection plane, a spectrophotometer 18 and a processor unit 20 connected thereto. The spectrophotometer 18 typically includes a light source 22 for generating a beam of light 24 of a predetermined wavelength range, light directing optics 26 and a detector unit 28. The light directing optics 26 are typically in the form of a beam deflector comprising an objective lens 30, a beam splitter 32 and a mirror 34. The detector nit 28 typically comprises an imaging lens 36, a variable aperture stop 38 coupled to and operated by its motor 40 and a spectrophotometric detector 42. The construction and operation of the spectrophotometer 18 may be of any known kind, for example, such as disclosed in U.S. Pat. No. 5,517,312 assigned to the assignee of the present application. Therefore, the spectrophotometer 18 need not be more specifically described, except to note the following.

The light beam 24 passes through the light directing optics 26 and impinges onto the structure 10 at a certain location defining a measurement area $S_1$. Light component 44 specularly reflected from the reflective regions within the area $S_1$ is directed onto the detector unit 28.

It should be noted that, generally, the illuminated location of the structure may be larger than the measurement area $S_1$, in which case suitable optics are provided for capturing, in a conventional manner, light reflected solely from the part (area $S_1$) within the illuminated location. In other words, the measurement area being of interest is included into a spot-size provided by the light beam 24 when impinging onto the structure 10. In order to facilitate understanding, assume that the illuminated area defined by the diameter of the incident beam constitutes the measurement area $S_1$.

The light directing optics 26 and detector unit 28 are designed such that only a zero-order light component of light reflected from the structure 10 is sensed by the spectrophotometric detector 42. The construction is such that the incident and detected light beams are directed substantially parallel to each other and substantially perpendicular to the surface of the structure 10. The diameter of the aperture stop 38 is variable and is set automatically according to the grid cycle of the measured structure. Generally speaking, the diameter of the aperture stop is optimized to collect the maximum reflected intensity excluding diffraction orders.

Additionally, the diameter of the incident beam 24, defining the measurement area $S_1$, is substantially larger than the surface area $S_0$ defined by the cell 12, that is:

$$S_1 > S_0$$

According to this specific example, the patterned structure 10 is a so-called "one-dimensional" structure. As clearly seen in FIG. 1b, the stacks 12a and 12b are aligned along the X-axis, while along the Y-axis the stacks continue to infinity (uniform structure) with respect to the measurement area $S_1$. In other words, the measurement area $S_1$ includes a structure that has one or more grid cycles extending along the X-axis and is uniform along the Y-axis.

The whole surface area S of the structure under inspection should be substantially larger than the measurement area $S_1$ defined by the diameter of the incident beam.

$$S > S_1$$

The case may be such that the above conditions are not available in the structure 10. For example, the structure may contain a single grid cycle. To this end, the measurement area $S_1$ consisting of more than one cell 12 should be located on a test-site (not shown).

For example, if the system 14 provides the numerical aperture of 0.2 and spot-diameter (measurement area $S_1$) about 15 μm the minimum surface area S of a test-site should be 20 μm. NovaScan 210 spectrophotometer, commercially available from Nova Measuring Instruments Ltd., Israel, may be used in the system 14.

Figure 3:
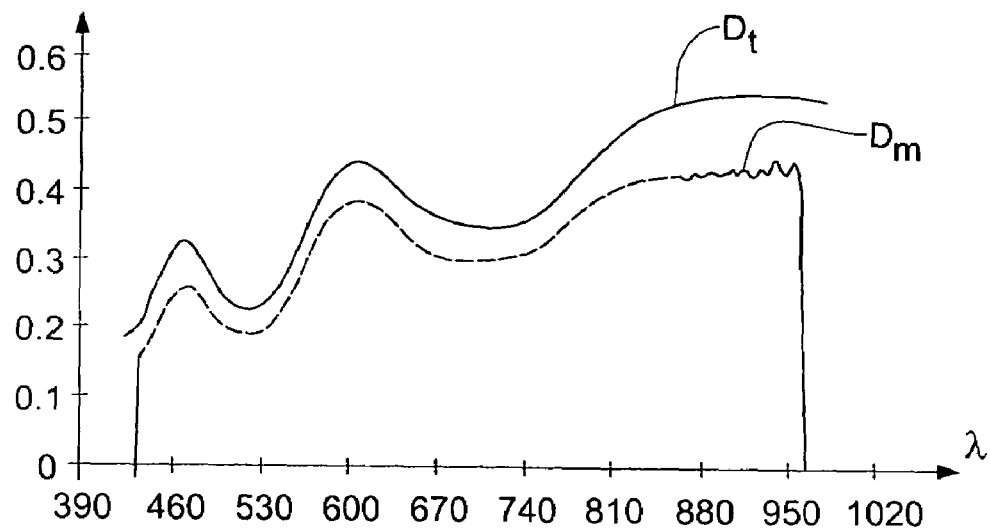
FIG. 3 is a graphical illustration of the main principles of the present is invention, showing the relationship between measured and theoretical data obtained by the apparatus of FIG. 2.

The spectrophotometer 18 measures the photometric intensities of different wavelengths contained in the detected, zero-order light component of the reflected beam 44. This is graphically illustrated in FIG. 3, being shown as a dashed cure $D_m$ constituting the measured data. The processor unit 20 comprises a pattern recognition software and a translation means so as to be responsive to the measured data and locate measurements. It is pre-programmed by a certain optical model based on at least some features of the structure for calculating theoretically the photometric intensities of light of different wavelengths reflected from a patterned structure. This is shown in FIG. 3 as a solid curve $D_t$, constituting theoretical data In order to design the optical model capable of estimating all the possible optical effects, which are dictated by the features of the structure to be measured and affect the resulting data, the following should be considered.

Generally, total specular reflection AR from the grid-like structure is formed of a coherent part $R_{coh}$ and an incoherent part $R_{incoh}$. It is known that coherence effects play an essential role in the measurements when a wide bandwidth radiation is used. The coherence length L of light in the optical system is determined by the radiation source and by the optical system (spectrophotometer) itself Reflection amplitudes from structure's features smaller than the coherence length interact coherently, producing thereby interference effects between light reflected by different stacks of the cell. For larger features, a non-negligible portion of light reflected by different stacks undergoes incoherent interaction without producing interference. The coherence length L defines a mutual coherence v of light coming from points separated by half a cycle of the grid structure, and, consequently, defines the degree of coherence γ, that is:

$$L = D \cdot \lambda$$

$$v = \frac{2 \cdot \pi \cdot (W_1 + W_2)}{2 \cdot L}$$

$$\gamma = \left(\frac{2 \cdot J_1(v)}{v}\right)^2$$

wherein D is a variable parameter determined experimentally for the actual optical system and stack structure based on the measured reflection spectra (measured data) for grids of varied cycle dimensions; $J_1$ is a known Bessel function. An approximate initial input for the determination of the parameter D may be given by nominal optical system characteristics. Hence, the total specular reflection R is given:

$$R = \gamma \cdot R_{coh} + (1-\gamma) \cdot R_{incoh}$$

In order to estimate the possible optical effects affecting the above parts of the total reflected signal, the following main factors should be considered, being exemplified with respect to the patterned structure 10 (FIGS. 1a and 1b):

1) Filling factors $a_1$ and $a_2$:

$$a_1 = \frac{W_1}{W_1 + W_2}$$

$$a_2 = \frac{W_2}{W_1 + W_2}$$

These factors represent the zero-order contribution, which is based only on the ratio of the areas of stacks 12a and 12b, respectively, in the reflection calculation. The zero-order signal is not sensitive to small details of the grid profile of the structure 10 such as edge rounding or local slopes. Therefore, the effects associated with diffracted light may not be considered.

2) Size coupling factors $c_1$ and $c_2$:

When the width of the stack is close to the wavelength the filing factors $a_1$ and $a_2$ should be corrected for reducing the coupling of the incident radiation to the respective stack. To this end, so-called "coupling factors" $c_1$ and $c_2$ should be introduced to the filling factors $a_1$ and $a_2$, respectively. The coupling factor gives a negligible effect when the width of the stack is relatively large relative to the wavelength and negates the interaction completely when the stack width is much smaller than the wavelength. Using a heuristic exponential function to give this dependence, the coupling factors are as follows:

$$c_1 = \exp\left\{-A \cdot \exp\frac{\lambda}{W_1}\right\}$$

$$c_2 = \exp\left\{-A \cdot \exp\frac{\lambda}{W_2}\right\}$$

wherein γ is the wavelength of a respective light component; A is a variable factor depending on the dimensions and materials of the structure and is determined experimentally for the actual stack structure, as will be described further below.

3) Dissipation $b_2$ in cavity-like structures:

It is often the case that one of the stacks is essentially dissipative owing to geometrical effects reducing reflection, which effects typically take place in cavity-like structures. Among these geometrical effects are high aspect-ratio trenches and wave-guiding underneath metal grid-like structures. High aspect-ratio structures are characterized by a dissipative effect that decreases the amount of light reflected back out with phase impact. For example, multiple reflections in deep grooves in metal both reduces the amount of light reflected back out and destroys the phase relation. The above effects are relatively strong for deep geometry and relatively weak for shallow structures (relative to the wavelength). Using a heuristic exponential function to give this dependence, a dissipation factor $b_2$ is given:

$$b_2 = \exp\left\{-B \cdot \frac{d_2}{\lambda}\right\}$$

wherein B is a variable size parameter, which is determined experimentally for the actual stack structure; $d_2$ is the depth of the cavity-like part of the stack. Here, by way of example only, the stack 12b is defined as a dissipative one.

In order to model the corrected filling factors, it is assumed that light radiation not reflected from a certain cell's stack from coupling considerations is essentially reflected by other cell's stack(s). The dissipation factor $b_2$ is taken into account in the reduced effective filling factor of the geometrically dissipative area. Hence, the corrected filling factors are as found:

$$A_1 = a_1 \cdot c_1 + a_2 \cdot (1 - c_2)$$

$$A_2 = (a_2 \cdot c_2 + a_1 \cdot (1 - c_1)) \cdot b_2$$

4) Polarization factors, representing the contribution of polarization effects that may take place in the case of metallic grids:

When the width of a cell's stack is close to the wavelength, a corrective factor should be introduced for reducing the coupling of the incident TE radiation to the respective stack owing to boundary conditions at the edges of metal lines. The polarization factor gives a negligible effect when the width of the stack is large relative to the wavelength and negates the reflection completely when the stack width is much smaller than the wavelength. Hence, the polarization factors $p_1$ and $p_2$ are given:

$$p_1 = \exp\left\{-C \frac{\lambda}{W_1}\right\}$$

$$p_2 = \exp\left\{-C \frac{\lambda}{W_2}\right\}$$

wherein C is a variable parameter determined experimentally for the actual stack structure. It is appreciated that in the absence of a pattern formed of metal lines, the optical factor C is equal to zero.

Similarly, in order to model the corrected filling factors, it is assumed that light radiation not reflected from a certain cell's stack from polarization considerations is essentially reflected by other cell's stack(s). Hence, the corrected filing factors are as found:

$$A_1 = a_1 \cdot c_1 \cdot p_1 + a_2 \cdot (1 - c_2 \cdot p_2)$$

$$A_2 = (a_2 \cdot c_2 \cdot p_2 + a_1 \cdot (1 - c_1 \cdot p_1)) \cdot b_2$$

The intensity of a reflected signal $r(\lambda)$ from each stack is calculated using layer thickness information and material optical parameters (constituting known features). To this end, standard equations for reflection from multi-layered stacks are used, based on Fresnel coefficients for reflection and transmission at interfaces as a function of wavelength for perpendicular incidence. The thickness for each layer is either known (being provided by the user) or calculated internally by the program. The materials of the layers and, therefore, their optical parameters, such as refraction indices and absorption, are known or calculated.

In view of the above and considering that both the coherent and incoherent parts contain contributions from two polarizations (e.g. $R_{coh} = R^{(p)} + R^{(s)}$), the total reflection $R_{TOT}$ constituting the theoretical data obtained by the optical model, is given:

$$R_{TOT} = \{|r_1 \cdot A_{1P} + r_2 \cdot A_{2P}|^2 + |r_1 \cdot A_{1S} + r_2 \cdot A_{2S}|^2\} \cdot \frac{\gamma}{2} +$$

$$\{|r_1|^2 \cdot A_{1P}^2 + |r_2|^2 \cdot A_{2P}^2 + |r_1|^2 \cdot A_{1S}^2 + |r_2|^2 \cdot A_{2S}^2\} \cdot \frac{1-\gamma}{2}$$

wherein $r_1$ and $r_2$ are the amplitudes of reflection from first and second stacks, respectively, of the cell, that is stacks 12a and 12b in the present example.

Other effects known in common practice (such as lateral reflection, roughness, etc.) have been found to have a negligible contribution under the defined conditions and are accounted for by the adjustment of the parameters A, B, C and D.

Turning back to FIG. 3, there is clearly illustrated that the curves $D_m$ and $D_t$ do not coincide, that is the theoretical data does not exactly match the measured data. A suitable merit function is used for determining the goodness of fit of the obtained results. By setting the values of the optical model parameters A, B, C and D the optical model is defined. By fitting the values of the desired parameters, e.g. $W_1$, $W_2$, $d_1$ and $d_2$, the theoretical data is optimized until the goodness of fit reaches a certain desired value (constituting a required condition). Upon detecting that the optimized theoretical data satisfies the required condition, the desired parameters of the structure, i.e. the $W_1$, $W_2$, $d_1$ and $d_2$ are calculated from the above equations.

It should be noted that in the most general case, when the grid cycle comprises two or more locally adjacent different elements (e.g., stacks), the above optical model is still correct. The mutual coherence v' is as follows:

$$v^i = \frac{\pi}{L} \sum_{i=1}^{n} W_i$$

wherein i is the i-th element (stack) in the grid cycle; n is the total number of elements within the grid cycle, and L is the coherence length. For the main factors on which the above optical model is based, we have:

Filling factor $$a_i = \frac{W_i}{\sum_{i=1}^{n} W_i}$$

Coupling factor $$c_i = \exp\left(-A \cdot \exp\frac{\lambda}{W_i}\right)$$

Dissipation factor $$b_m = \exp\left(-B_m \frac{d_m}{\lambda}\right)$$

wherein m is the number of a dissipative element of the n stacks; $d_m$ is the depth of the cavity-like part of the stack in relation to the neighboring stacks. For a non-dissipative stack, $b_n=1$, wherein $n \neq m$.

Polarization factor $$p_i = \exp\left\{-C \cdot \frac{\lambda}{W_i}\right\}$$

Corrected filling factor $$A_j = b_i \cdot \left[a_i \cdot c_i \cdot p_i + \sum_{j=1(j \neq i)}^{n} a_j(1 - c_j \cdot p_j)\right]$$

In view of the above, the total reflection $R'_{TOT}$ is as follows:

$$R'_{TOT} = \left\{\left|\sum_i (r_i \cdot A_{ip})\right|^2 + \left|\sum_i (r_i \cdot A_{ix})\right|^2\right\} \cdot \frac{\gamma}{2} + \left\{\sum_i (|r_i|^2 \cdot A_{ip}^2) + \sum_i (|r_i|^2 \cdot A_{ix}^2)\right\} \cdot \frac{1-\gamma}{2}$$

Figure 4:
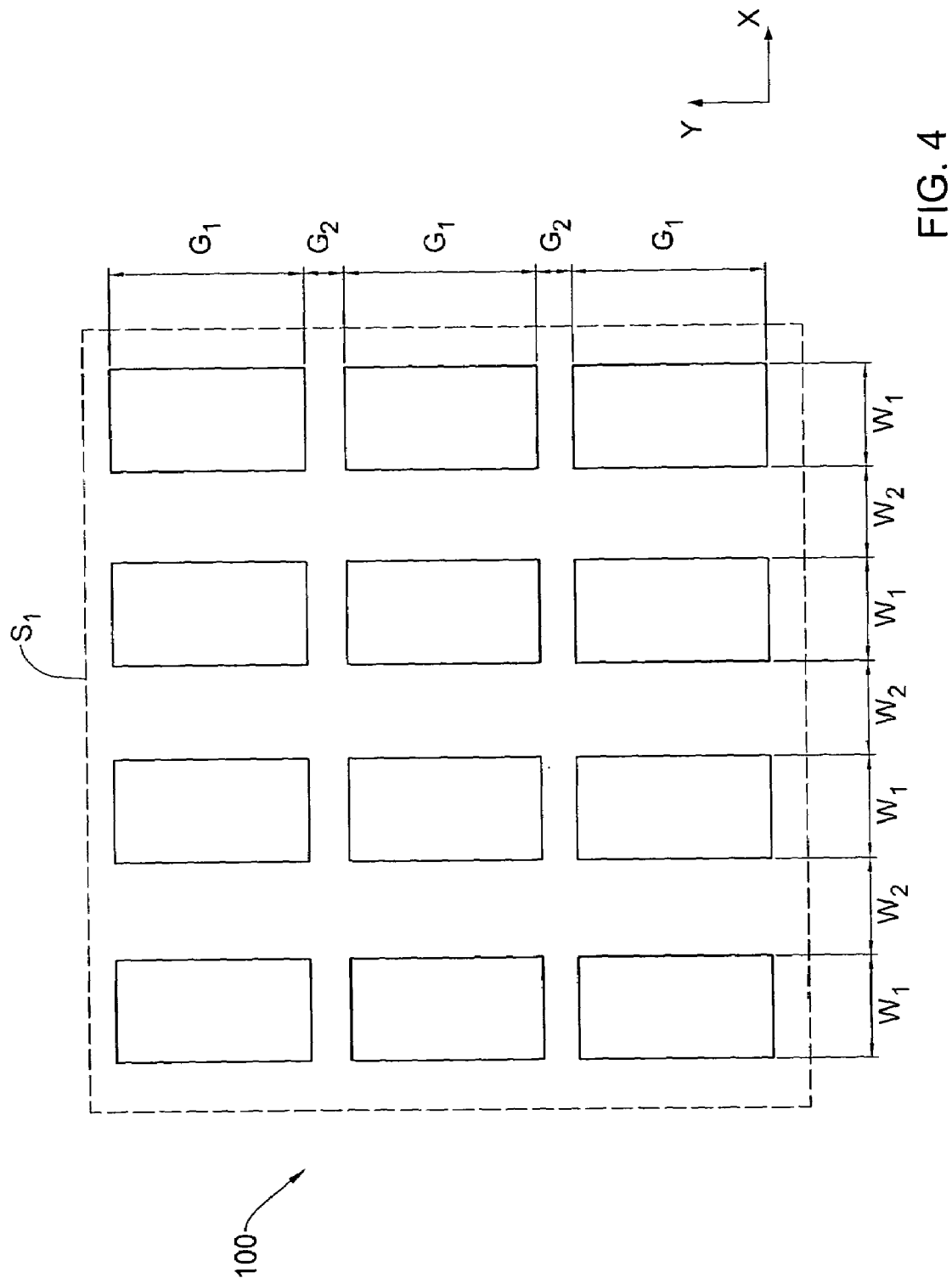
FIG. 4 illustrates yet another example of a patterned structure to be measured with the apparatus of FIG. 3.

Referring to FIG. 4, there is illustrated a part of a so-called "two-dimensional" structure 100, i.e. a structure periodical in both X- and Y-axes. This structure 100 is characterized by a plurality of grid cycles aligned along both the X- and Y-axes. The cycle aligned along the X-axis is formed of a pair of elements $W_1$ and $W_2$ (the stacks' widths), and the cycle aligned along the Y-axis is formed of a pair of is elements $G_1$ and $G_2$ (the stacks' lengths). For example, the elements $G_1$ and $G_2$ may be, respectively, a metal layer stack and a block of Inter Layer Dielectric (ILD) stack. The measurement area $S_1$ defined by the diameter of the incident beam includes at least one cycle in X-direction and at least one cycle in Y-direction (several cycles in the present example).

Generally speaking, the cycle in either X- or Y-axis may be composed of several elements (e.g., stacks). If the measurement area $S_1$ is smaller than the surface area defined by the grid cycle along one of the axes X or Y, the total reflection (theoretical data) is determined in the manner described above with respect to the one-dimensional structure 10 (FIGS. 1a and 1b). If the measurement area is larger than the surface area defined by the grid cycle along both X- and Y-axes, then for the total reflection $R_{2D}$ of such a 2D-structure we have:

$$R_{2-D} = \frac{G_1}{G_1 + G_2} \cdot R_{\sigma_1} + \frac{G_2}{G_1 + G_2} \cdot R_{\sigma_2}$$

wherein $R_{G1}$ and $R_{G2}$ are the intensities of reflection signals from the two one-dimensional structures aligned along the Y-axis and having the widths $G_1$ and $G_2$, respectively. It should be noted that the Y-axis is no more than a notation, i.e. has no physical significance, and can be exchanged with the X-axis. For the general case of k elements in the cycle aligned along the Y-axis, we have:

$$R_{2D} = \frac{\sum_{i=1}^{k} G_i \cdot R_{\sigma_i}}{\sum_{i=1}^{k} G_1}$$

wherein $R_{Gi}$ and $G_i$ are the reflection intensity from and width of the i-th element.

In general the axis location for calculating the reflection intensities $R_{Gi}$ is chosen so as to satisfy the following:

$$G_1 + G_2 > W_1 + W_2$$

If the above condition is not satisfied, than the two axes are exchanged accordingly.

Figure 5A:
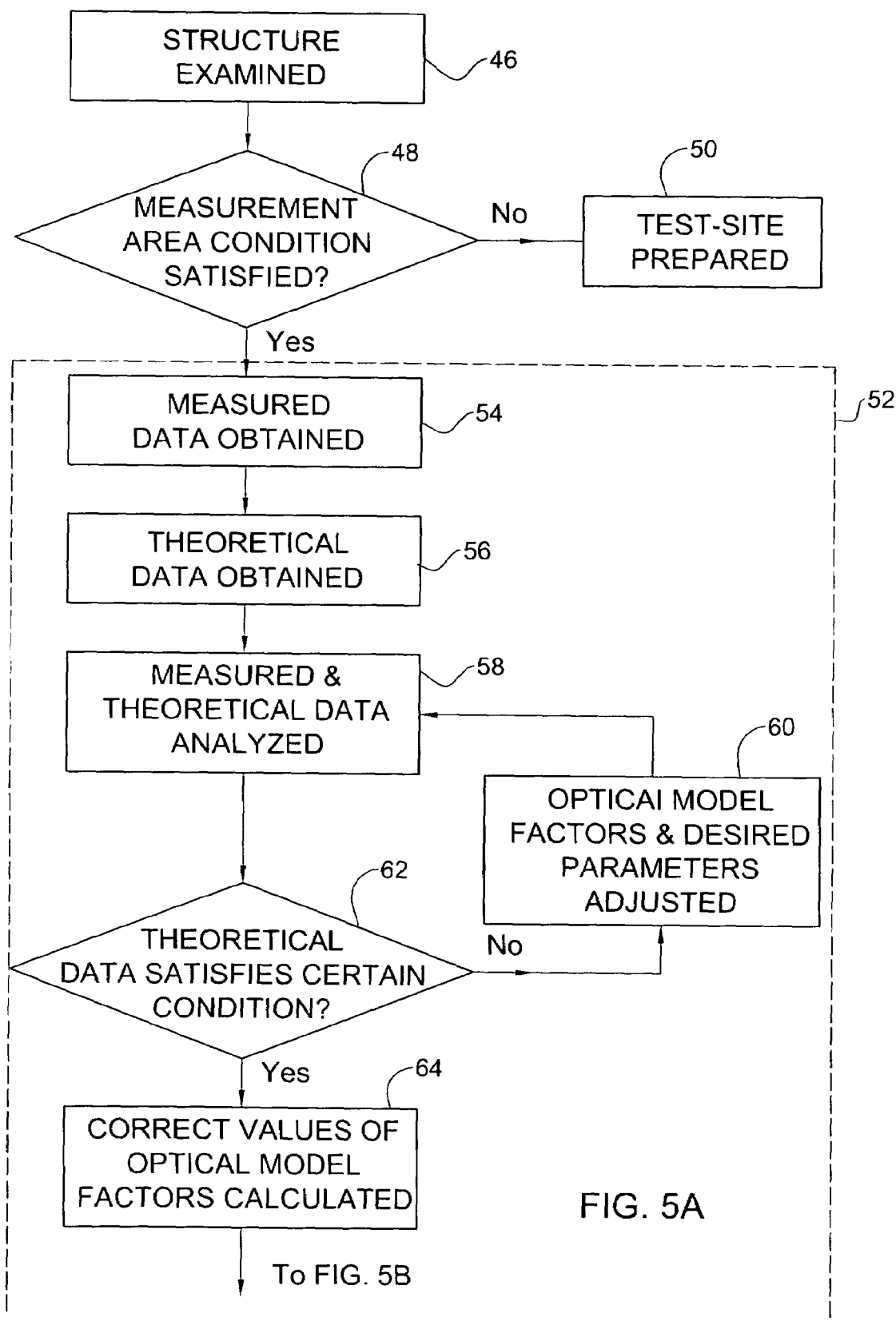
FIGS. 5a and 5b illustrate a flow diagram of the main steps of a method according to the invention.
Figure 5B:
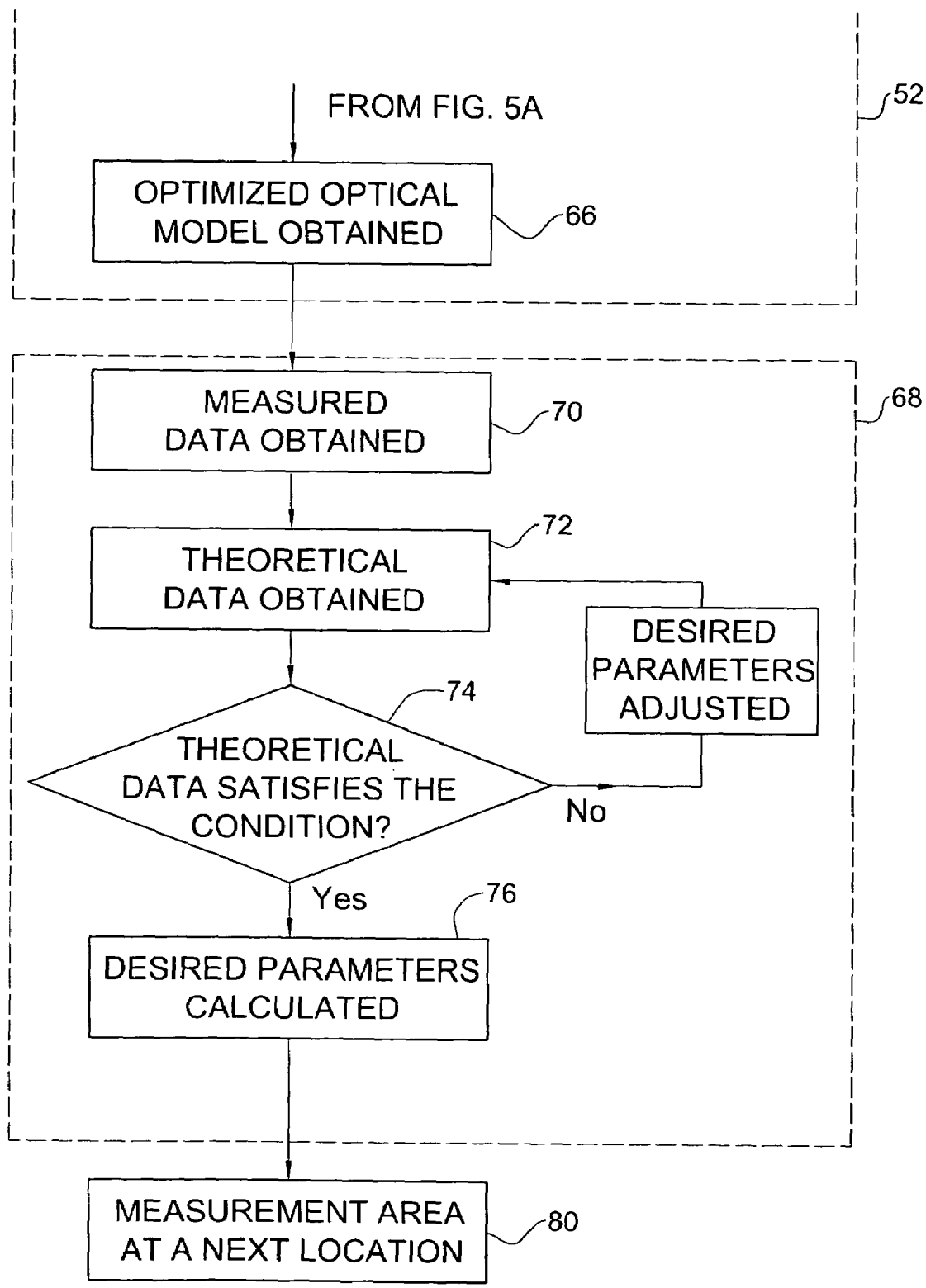

The main principles of a method according to the invention will now be described with reference to FIGS. 5a and 5b. The structure of the required measurement area is examined (step 46) so as to determine whether the above measurement area condition is satisfied within the existing pattern (step 48). If this condition is not satisfied, a test-site structure satisfying the condition is designed on the reticle (step 50), the test-site being typically provided within a so-called "margin region".

Then, an initial learning mode of operation is performed, generally at step 52. The learning mode is aimed, on the one hand, at providing the measured data and, on the other hand, at optimizing the optical model. During the learning mode, the system 14 operates in the manner described above for detecting light reflected from the illuminated area substantially at zero-order and obtaining the measured data in the form of photometric intensities of each wavelength within the wavelength range of the incident radiation (step 54). Concurrently, the processor 20 applies the above optical model for obtaining the theoretical data (step 56) and compares it to the measured data (step 58). The optical model is based on some known features of the structure and nominal values of unknown features (i.e. of the desired parameters to be measured) which are provided by the user. At this stage, the relation between the theoretical data and the measured data is compared to a certain condition (step 62). If the condition is satisfied then, correct values of the parameters A, B, C and D are calculated (step 64) and an optimized optical model is obtained (step 66). If the condition is not satisfied then the optical model factors A, B, C and D and the unknown features are adjusted (step 60) until the condition is satisfied. It should be noted, although not specifically illustrated, that at this initial learning stage; the desired parameters can be calculated.

Thereafter the measurement mode of operation is performed, generally at step 68. To this end, the measured and theoretical data are concurrently produced (steps 70 and 72, respectively). It is appreciated that the theoretical data now produced is based on the known parameters of the structure, previously calculated correct values of the optical factors A, B, C and D and on the nominal values of the desired parameters to be measured. Similarly, the optimized theoretical data is compared to the measured data so as to determine whether or not the theoretical data satisfies a required condition (step 74),. e.g. the goodness of fit is of a desired value. If so, the desired parameters are calculated (step 76) and if not the desired parameters are adjusted (step 78) until the theoretical data substantially matches the measured data. If desired, the measurement mode (step 68) is then repeated for inspecting a further location on the structure 10 (step 80).

Figure 6:
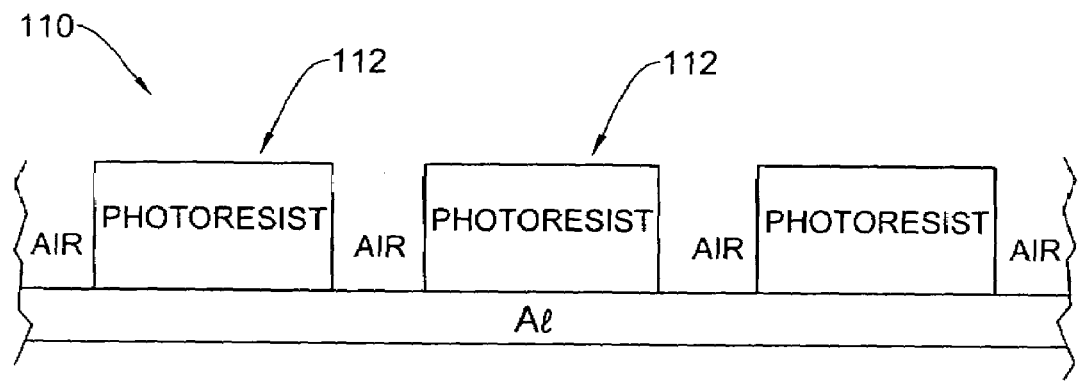
FIGS. 6 to 10 are schematic cross-sectional views of five more examples of patterned structures suitable to be inspected by the apparatus of FIG. 2.
Figure 7:
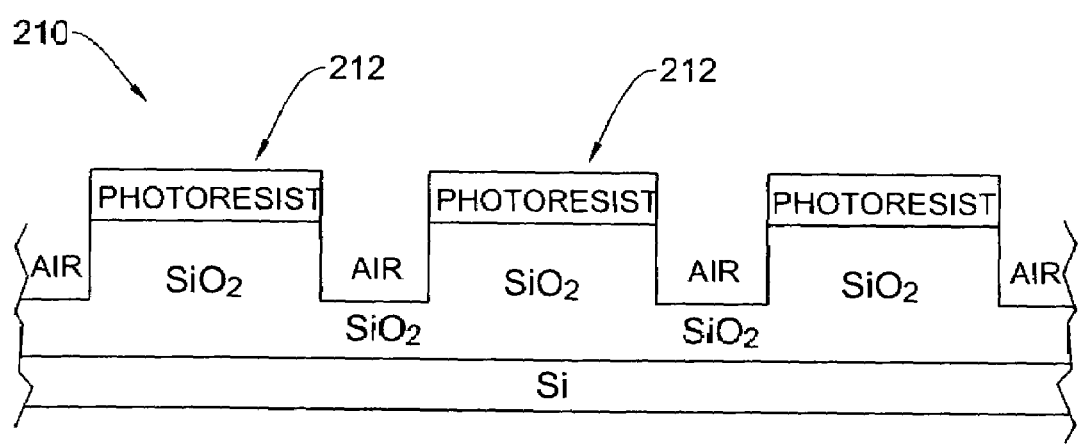

Referring to FIGS. 6 and 7, there are illustrated in a self-explanatory manner two examples of patterned structures, designated 110 and 210, respectively, which can be inspected in the above described manner by the system 14. Each of the structures 110 and 210 consists of cells 112 and 212, respectively, each cell including two stacks formed of different layers. The parameters to be measured in these structures are, respectively, the width of a photoresist layer on top of the aluminum and the depth of the etched area (Air) within the silicon oxide layer.

Figure 8:
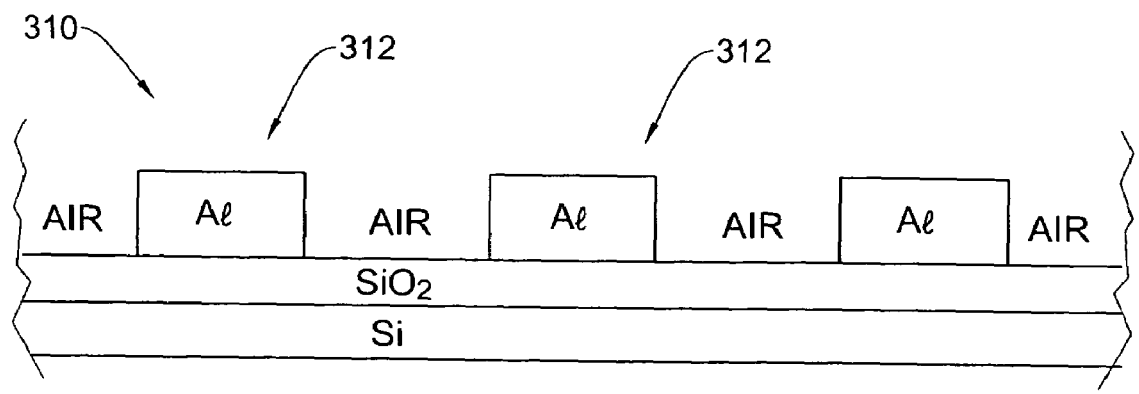
Figure 9:
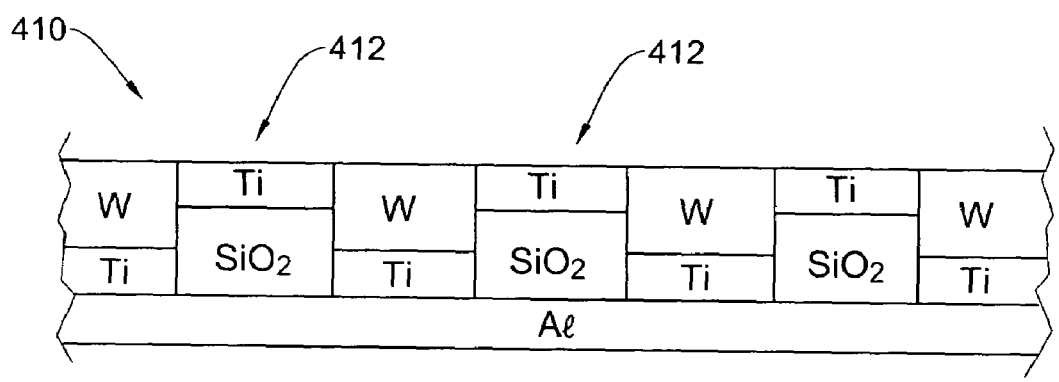

Referring to FIGS. 8 and 9, there are illustrated two more example of patterned structures, designated 310 and 410, respectively, whose parameters can be measured in accordance with the invention. Here, the parameters to be measured are, respectively, the width and thickness of an aluminum layer on top of the silicon oxide and the remaining thickness of the metallic layer on the silicon oxide layer undergoing chemical mechanical polishing.

It is appreciated that polarization effects are present in the structures 310 and 410 due to the existence of patterned metal in both structures, while being weak in the structures 110 and 210.

Figure 10:
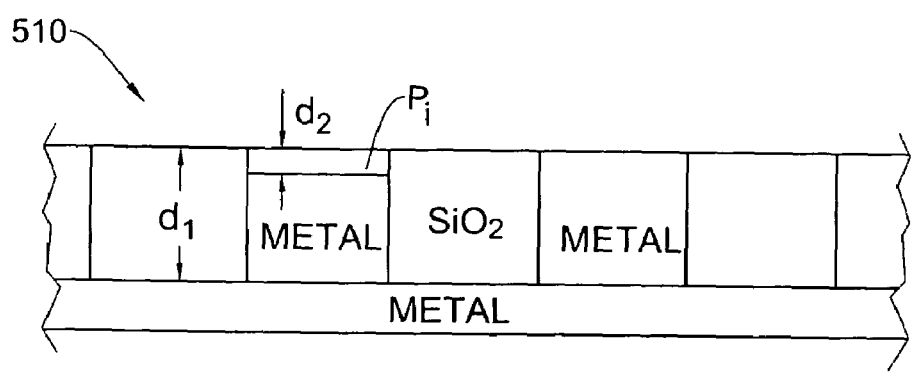

FIG. 10 illustrates a patterned structure 510 utilizing copper under and between any two $S_iO_2$-based layers known as Interlayer Dielectric (ILD) insulating layer. CMP process applied to such a copper-based structure 510 typically results in copper loss portions, generally at $P_i$, a so-called "dishing" effect. This effect is associated with the properties of copper (e.g., softer nature as compared to other metals) and the chemical nature of the copper-based CMP process. The parameters to be measured are the depths $d_1$ and $d_2$ of, respectively, the uppermost ILD insulating layer and the dishing-associated portion $P_i$. In certain cases, depending on the layer stacks, the metal thickness can be determined by $(d_1-d_2)$.

It has been found by the inventors that the measurements can be even more optimized by taking into account the relation between the wavelength $\lambda$ of incident light and the pitch size of the patterned structure (i.e., $\Lambda=W_1+W_2$ in the above examples), when selecting an optical model to be used. The above-described optical model is the optimal one for the case when $\Lambda > \lambda$.

Figure 11:
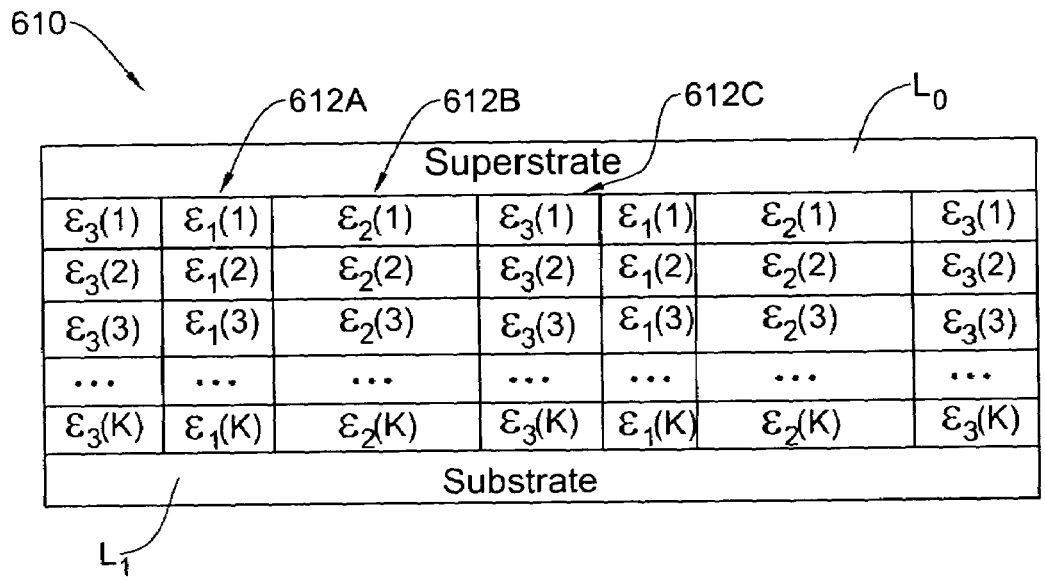
FIGS. 11 and 12 illustrate two examples, respectively, of patterned structures to be measured, wherein one-dimensional periodicity in layers is considered.

Reference is now made to FIG. 11 showing a patterned structure 610 formed on a substrate layer $L_1$. The structure 610 is composed of a plurality of cells (grid cycles) 612, two such cells being completely shown in the figure, and can for example be formed of straight lines of metal in dielectric matrix. In this specific example, each grid cycle 612 comprises three stacks 612a, 612b and 612c. Each stack is formed of different K layers having different dielectric permittivity $\epsilon$. More specifically, the stack 612a includes K layers with the dielectric permittivities $\epsilon_1(1)$, $\epsilon_1(2)$, ..., $\epsilon_1(K)$, respectively; the stack 612b includes K layers with the dielectric permittivities $\epsilon2(1)$, $\epsilon_2(2)$, ..., $\epsilon_2(K)$, respectively; and the stack 612c includes K layers with the dielectric permittivities $\epsilon_3(1)$, $\epsilon_3(2)$, ..., $\epsilon_3(K)$, respectively. An ambient, "superstrate" layer $L_0$ is considered as the upper layer of the structure 610.

Thus, the entire structure to be measured is formed of j layers including the 0-th superstrate layer $L_0$, K stack layers, and the lower substrate layer $L_1$, that is, j=K+2. Index j=0 corresponds to the superstrate layer $L_0$, and index j=K+1 corresponds to the substrate layer $L_i$.

In the present example, the normal incidence of light onto the patterned structure 612 (e.g., strait lines of metal in dielectric matrix) is considered. Here, the Z-axis is perpendicular to the surface of the structure (i.e., parallel to the direction of propagation of incident light towards the structure), the X-axis is perpendicular to the lines of metal (i.e., elements of the pattern), and the Y-axis is parallel to the metal lines.

In the most general case, Fe structure 612 has N stacks (n=1, ..., N), each with K layers, the width of the n-th stack being $\Delta X_n$. The structure pitch $\Lambda_X$ is thereby determined as follows:

$$\Lambda_X = \sum_{n=1}^{N} \Delta X_n$$

The interaction of the incident light with each layer can be described using the effective permittivity tensor:

$$\varepsilon = \begin{pmatrix} \varepsilon_X & 0 \\ 0 & \varepsilon_Y \end{pmatrix}$$

The above tensor describes the case of relatively small values of pitch $\Lambda_X$ (the period of grating along the X-axis), as compared to the wavelength of incident light $\lambda$, i.e., $\Lambda_X/\lambda < 1$. The tensor components $\epsilon_X$ and $\epsilon_Y$ correspond to the electric field vector parallel to the X-axis and Y-axis, respectively (i.e., perpendicular (TM) and parallel (TE) to the metal lines, respectively).

Keeping in mind that the structure under measurements is composed of a plurality of layers, the components of the effective permittivity tensor, $\epsilon_X(j)$ and $\epsilon_Y(j)$, in j-th layer have the form:

$$[\varepsilon_X(j)]^{-1} = \sum_{n=1}^{N} [\varepsilon_n(j)]^{-1} \frac{\Delta X_n}{\Lambda_X}$$

$$\varepsilon_Y(j) = \sum_{n=1}^{N} \varepsilon_n(j) \frac{\Delta X_n}{\Lambda_X}$$

wherein $\epsilon_n(j)$ is the permittivity of j-th layer in n-th stack, $\Delta X_n$ is the width of the n-th stack; N is the number of stacks.

The total reflectivity of the structure $R_{TOT}$ has the form:

$$R_{TOT} = \psi |R_X(0)|^2 + (1-\psi)|R_Y(0)|^2$$

wherein $\psi$ describes the polarization of light $\psi=0$ for light polarized along Y-axis, $\psi=1$ for light polarized along the X-axis, $\psi=0.5$ for unpolarized light; $R_X(0)$ and $R_Y(0)$ are reflectivity amplitudes of the entire structure along the X- and Y-axis, respectively, which are functions of the effective permittivity.

The reflectivity amplitudes $R_X(j)$ and $R_Y(j)$ can be determined using the following recurrent expressions:

$$R_X(j) = \frac{r_X(j) + R_X(j+1)\exp[-2i\sigma_X(j+1)]}{1 + r_X(j) + R_X(j+1)\exp[-2i\sigma_X(j+1)]} \quad \text{for } j = K, K-1, \ldots, 1, 0.$$

$$R_Y(j) = \frac{r_Y(j) + R_Y(j+1)\exp[-2i\sigma_Y(j+1)]}{1 + r_Y(j) + R_Y(j+1)\exp[-2i\sigma_Y(j+1)]} \quad \text{for } j = K, K-1, \ldots, 1, 0.$$

wherein $r_X(j)$ and $r_Y(j)$ are reflectivity amplitudes of each of the j layers, $\sigma_X(j)$ and $\sigma_Y(j)$ are complex coefficients shot both the attenuation and phase shift of the TM or TE light within the j-th layer, and are determined as follows:

$$r_X(j) = \frac{\sqrt{\varepsilon_X(j)} - \sqrt{\varepsilon_X(j+1)}}{\sqrt{\varepsilon_X(j)} - \sqrt{\varepsilon_X(j+1)}} \quad r_Y(j) = \frac{\sqrt{\varepsilon_Y(j)} - \sqrt{\varepsilon_Y(j+1)}}{\sqrt{\varepsilon_Y(j)} - \sqrt{\varepsilon_Y(j+1)}}$$

$$\sigma_X(j) = \frac{2\pi}{\lambda} d(j)\sqrt{\varepsilon_X(j)} \quad \sigma_Y(j) = \frac{2\pi}{\lambda} d(j)\sqrt{\varepsilon_Y(j)}$$

In the above equations, d(j) is the thickness (depth) of the j-th layer

The reflectivity amplitudes $r_X(j)$ and $r_Y(j)$ do not take into account the interference of waves reflected from different layers. They describe the reflectivity from the interface between the j-th and (j+1)-th substances only. In other words, they correspond to the reflectivity from the interface of two semi-infinite volumes with the permittivities $\varepsilon_X(j)$ and $\varepsilon_X(j+1)$ in the case of TM polarization, and with the permittivities $\varepsilon_Y(j)$ and $\varepsilon_Y(j+1)$ for TE polarization.

On the other hand, the reflectivity amplitudes $R_X(j)$ and $R_Y(j)$ describe the reflectivity from the (j+1)-th layer with taking into account the interference of the waves reflected from the interfaces between the different layers. Thus, $R_X(0)$ and $R_Y(0)$ correspond to the reflectivity from the upper layer $L_0$ of the measured structure for TM and TE polarizations, respectively.

As indicated above, the complex coefficients $\sigma_X(j)$ and $\sigma_Y(j)$ show both attenuation and phase shift of the TM or TE light within the j-th layer: the real part of $\sigma$ describes the phase shift, and the imaginary part of $\sigma$ describes the attenuation coefficient.

For the reflectivity amplitudes, the complex coefficients, and permittivity of the 0-th and (K+1)-th layers, we have:

$$R_X(K+1) = 0 \quad R_Y(K+1) = 0$$

$$\sigma_X(K+1) = 0 \quad \sigma_Y(K+1) = 0$$

$$\varepsilon_X(0) = \varepsilon_{L0} \quad \varepsilon_Y(0) = \varepsilon_{L0}$$

$$\varepsilon_X(K+1) = \varepsilon_{L1} \quad \varepsilon_Y(K+1) = \varepsilon_{L1}$$

Let us generalize this approach to take into account one more possible case of so-called "middle pitches" with respect to the wavelength of incident light, i.e., $\Lambda \sim \lambda$. In this case, the reflectivity amplitudes are function of the effective permittivity of each n-th stack in j-th layer. The effective permittivity tensor has the form:

$$\varepsilon(j, n) = \begin{pmatrix} \varepsilon_X(j, n) & 0 \\ 0 & \varepsilon_Y(j, n) \end{pmatrix}$$

wherein $\varepsilon_X(j, n)$ and $\varepsilon_Y(j, n)$ are as follows:

$$\varepsilon X(j,n) = \varepsilon X(j) + \alpha(\lambda)[\varepsilon_n(j) - \varepsilon X(j)]$$

$$\varepsilon Y(j,n) = \varepsilon Y(j) + \alpha(\lambda)[\varepsilon_n(j) - \varepsilon Y(j)]$$

Here, $\alpha(\lambda)$ is the coefficient, which is the monotonically decreasing function of wavelength of incident light $\lambda$, and is indicative of the effect of "mixing" of the two limiting cases $\Lambda > \lambda$ and $\Lambda < \lambda$; $\alpha = 0$ for the case of $\Lambda < \lambda$, $\alpha = 1$ for the case $\Lambda > \lambda$, and $0 < \alpha < 1$ for the case of $\Lambda \sim \lambda$.

Using the analogous formulas for each stack (rather an each layer), the total reflectivity $R_{TOT}$ can be expressed as follows:

$$R_{TOT} = \psi \left| \sum_{n=1}^{N} R_X(0, n) \frac{\Delta X_n}{\Lambda_X} \right|^2 + (1-\psi) \left| \sum_{n=1}^{N} R_Y(0, n) \frac{\Delta X_n}{\Lambda_X} \right|^2$$

wherein N is the number of stacks; $R_X(j,n)$ and $R_Y(j,n)$ are the reflectivity amplitudes for n-th stack and can be obtained using the previous recurrent equations, but utilizing the values of $\varepsilon_X(j,n)$ and $\varepsilon_Y(j,n)$ instead of values of $\varepsilon_X(j)$ and $\varepsilon_Y(j)$, respectively.

The reflectivity amplitudes $R_X(j,n)$ and $R_Y(j,n)$ can be obtained using the following recurrent expressions:

$$R_X(j, n) = \frac{r_X(j, n) + R_X(j+1, n)\exp[-2i\sigma_X(j+1, n)]}{1 + r_X(j, n) + R_X(j+1, n)\exp[-2i\sigma_X(j+1, n)]} \quad \text{for } j = K, K-1, \ldots, 1, 0$$

$$R_Y(j, n) = \frac{r_Y(j, n) + R_Y(j+1, n)\exp[-2i\sigma_Y(j+1, n)]}{1 + r_Y(j, n) + R_Y(j+1, n)\exp[-2i\sigma_Y(j+1, n)]} \quad \text{for } j = K, K-1, \ldots, 1, 0$$

$$r_X(j, n) = \frac{\sqrt{\varepsilon_X(j, n)} - \sqrt{\varepsilon_X(j+1, n)}}{\sqrt{\varepsilon_X(j, n)} - \sqrt{\varepsilon_X(j+1, n)}} \quad r_Y(j, n) = \frac{\sqrt{\varepsilon_Y(j, n)} - \sqrt{\varepsilon_Y(j+1, n)}}{\sqrt{\varepsilon_Y(j, n)} - \sqrt{\varepsilon_Y(j+1, n)}}$$

$$\sigma_X(j, n) = \frac{2\pi}{\lambda} d(j)\sqrt{\varepsilon_X(j, n)} \quad \sigma_Y(j, n) = \frac{2\pi}{\lambda} d(j)\sqrt{\varepsilon_Y(j, n)}$$

As indicated above, the reflectivity amplitudes $r_X(j,n)$ and $r_Y(j,n)$ do not take into account the interference of the waves reflected from different layers. They describe the reflectivity from the interface between the j-th and (j+1)-th substances only. In other words, they correspond to the reflectivity from the interface of two semi-infinite volumes with the permittivities $\varepsilon_X(j,n)$ and $\varepsilon_X(j+1,n)$ in the case of TM polarization, and with the permittivities $\varepsilon_Y(j,n)$ and $\varepsilon_Y(j+1, n)$ in the case of TE polarization. The reflectivity amplitudes $R_X(j,n)$ and $R_Y(j,n)$ describe the reflectivity from the (j+1)-th layer within the n-th stack with taking into account the interference of the waves reflected from interfaces between the different layers. Thus, $R_X(0,n)$ and $R_Y(0,n)$ correspond to the reflectivity from the n-th stack in the upper layer of the measured structure for TM and TE polarizations, respectively.

The complex coefficients $\sigma_X(j,n)$ and $\sigma_Y(j,n)$ show both the attenuation and phase shift of the TM or TE light within the n-th stack of the j-th layer: the real part of $\sigma$ describes the phase shift, and the imaginary part of $\sigma$ describes the attenuation coefficient.

Index j=0 corresponds to the superstrate layer $L_0$, Index j=K+1 corresponds to the substrate layer $L_1$. Thus, we have:

$R_X(K+1,n)=0 \; R_Y(K+1,n)=0$ $\sigma X(K+1,n)=0 \; \sigma Y(K+1,n)=0$ $\epsilon X(0,n)=_{\epsilon L0} \; \epsilon Y(0,n)=_{\epsilon L0}$ $\epsilon X(K+1,n)=_{\epsilon L1} \; \epsilon Y(K+1,n)=_{\epsilon L1}$ Referring to FIG. 12, there is illustrated a patterned structure 710 composed of grid cycles 712 (two such cycles being shown in the figure), which are formed on a substrate layer $L_1$ and are covered by a superstrate air layer $L_0$. In this specific example, the Cu-polishing during the dual Damascene process is considered. The grid cycle 712 consists of two stacks 712a and 712b of equal widths $\Delta X_1$ and $\Delta X_2$, respectively, such that $\Delta X_1=\Delta X_2=\Lambda/2$, $\Lambda$ being the pitch.

In this case, the number K of stack layers is 3, and the total number of layers including the substrate and superstrate layers is 5, i.e., j=0,1,2,3,4. The condition of j=4 corresponds to the substrate layer $L_1$ (Si). The condition of j=3 corresponds to the lower oxide layer ($SiO_2$) with the thickness of about 5000 A. The condition of j=2 corresponds to an etch stop layer ($Si_3N_4$) with the thickness of about 1000 A. The condition of j=1 is the metal-containing layer (Cu in the first stack, and $SiO_2$ in the second stack) with the thickness of about 5000 A. The condition of j=0 corresponds to the superstrate layer $L_0$ (water/air layer).

In this case, we have the trivial results for the layers 0, 2, 3, and 4, as follows:

$\epsilon X(4,1)=\epsilon X(4,2)=\epsilon(Si) \; \epsilon Y(4,1)=\epsilon Y(4,2)=\epsilon(Si)$ $\epsilon X(3,1)=\epsilon X(3,2)=\epsilon(SiO_2) \; \epsilon Y(3,1)=\epsilon Y(3,2)=\epsilon(SiO_2)$ $\epsilon X(2,1)=\epsilon X(2,2)=\epsilon(Si_3N_4) \; \epsilon Y(2,1)=\epsilon Y(2,2)=\epsilon(Si_3N_4)$ $\epsilon X(0,1)=\epsilon X(0,2)=\epsilon(Air)=1 \; \epsilon Y(0,1)=\epsilon Y(0,2)=\epsilon(Air)=1$ For the metal-containing layer (j=1) with periodic structure (grating) we have the following results:

ti $\epsilon X(1)=1/(0.5/\epsilon(Cu)+0.5/\epsilon(SiO_2))$–average permittivity for TM polarization $\epsilon X(1,1)=\epsilon X(1)+\alpha(\lambda)[\epsilon(Cu)-\epsilon X(1)] \; \epsilon X(1,2)=\epsilon X(1)+\alpha(\lambda)[\epsilon(SiO_2)-\epsilon X(1)]$ $\epsilon Y(1)=0.5\epsilon(Cu)+0.5\epsilon(SiO_2)$–average permittivity for TE polarization $\epsilon Y(1,1)=\epsilon Y(1)+\alpha(\lambda)[\epsilon(Cu)-\epsilon Y(1)] \; \epsilon Y(1,2)=\epsilon Y(1)+\alpha(\lambda)[\epsilon(SiO_2)-\epsilon Y(1)]$ Here, $\alpha(\lambda)$ is the coefficient indicative of the "mixing" of two cases: $\Lambda>\lambda$ and $\Lambda<\lambda$. The value $\alpha(\lambda)$ depends on the ratio between the pitch and the wavelength. Let us present the coefficient $\alpha(\lambda)$ as a linear function of wavelength $\lambda$ (in nm):

$\alpha(\lambda)=\alpha_{500}+(\alpha_{900}-\alpha_{500})(\lambda-500)/(900-500)$ If $\alpha(\lambda)<0$, then $\alpha(\lambda)=0$. If $\alpha(\lambda)>1$ then $\alpha(\lambda)=1$. Here, $\alpha_{500}$ and $\alpha_{900}$ are the values of the coefficient $\alpha$ for the wavelength $\lambda$ equal to 500 nm and 900 nm, respectively. For measured wavelength ranging between 500 nm and 900 nm, the approximate values of $\alpha_{500}$ and $\alpha_{900}$ for different values of pitch may be as follows:

For $\Lambda<0.20$ μm, $\alpha_{500}\approx 0.0$ and $\alpha_{900}\approx 0.0(\Lambda<\lambda)$;

For $\Lambda=0.32$ μm, $\alpha_{500}\approx 0.1$ and $\alpha_{900}\approx 0.2$;

For $\Lambda=0.70$ μm, $\alpha_{500}\approx 0.5$ and $\alpha_{900}\approx 0.7$;

For $\Lambda=1.50$ μm, $\alpha_{500}\approx 0.7$ and $\alpha_{900}\approx 0.9$;

For $\Lambda>4.00$ μm, $\alpha_{500}\approx 1.0$ and $\alpha_{900}\approx 1.0(\Lambda>\lambda)$ The above values are presented as non-limiting examples only. It should be understood that the values of $\alpha_{500}$ and $\alpha_{900}$ are considered as fitting parameters, because they depend not only on the ratio $\Lambda/\lambda$, but on the geometry of the structure as well (metal density, optical constants, substances, exact stack structure, roughness of the interface between the different stacks, etc.). These parameters $\alpha_{500}$ and $\alpha_{900}$ should be optimized once per each structure, and after fixing these optimized values, they should be maintained constant during the measurements.

Figure 12:
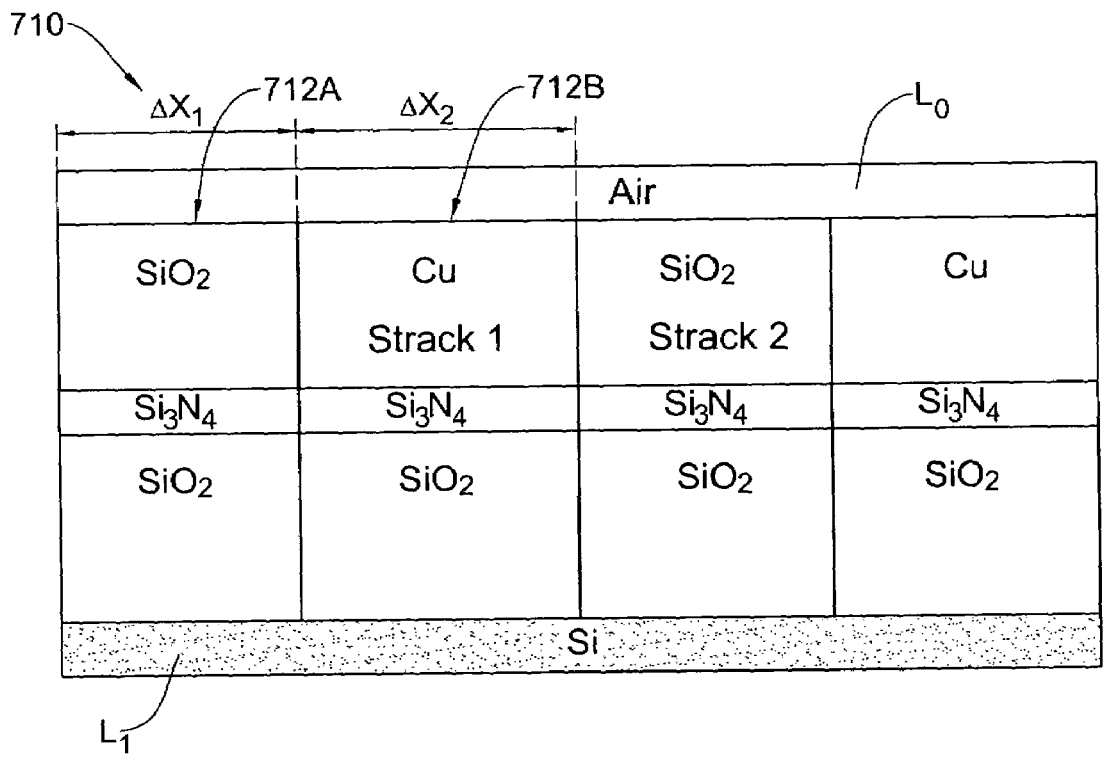

In the previous examples of FIGS. 11 and 12, one-dimensional periodicity in the layers was considered. To measure the oxide thickness in DRAM applications, however, the spectra from layers with two-dimensional structure within the layers have to be analyzed. To this end, the previous one-dimensional consideration can be easily generalized to the case of the alternative (perpendicular) lines (metal lines) in different layers, i.e. the two-dimensional stack.

Figure 13A:
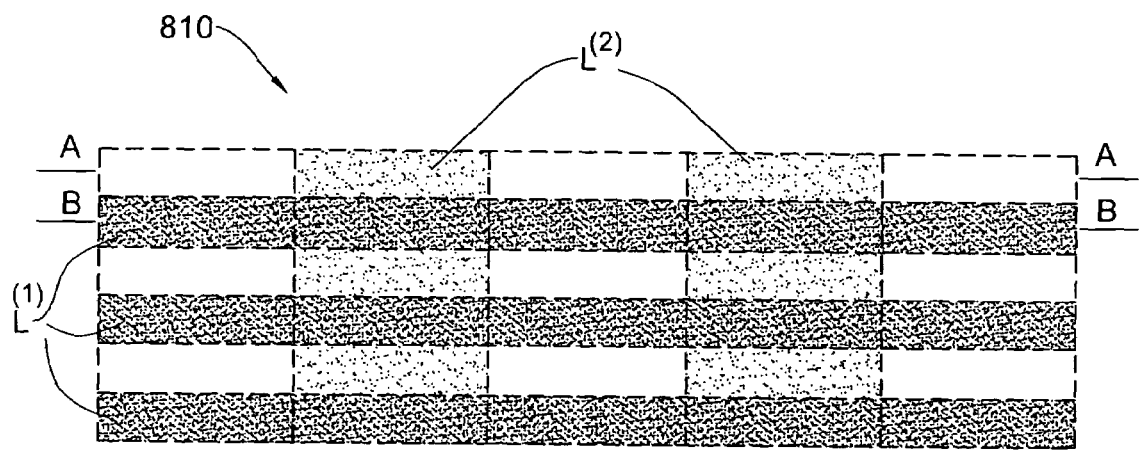
Figure 13B:
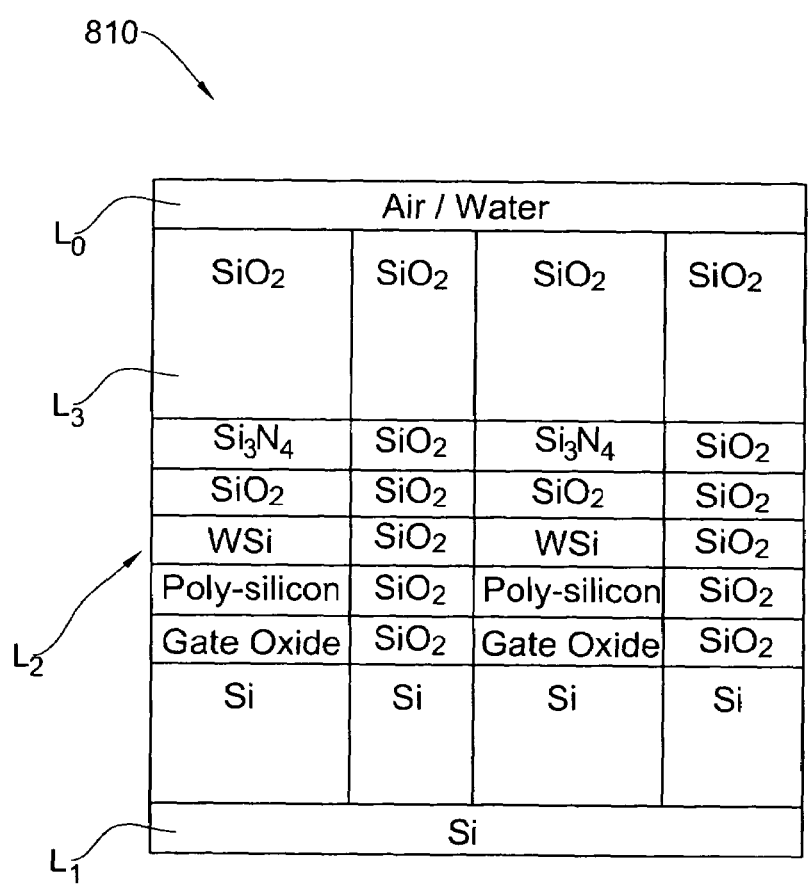
Figure 13C:
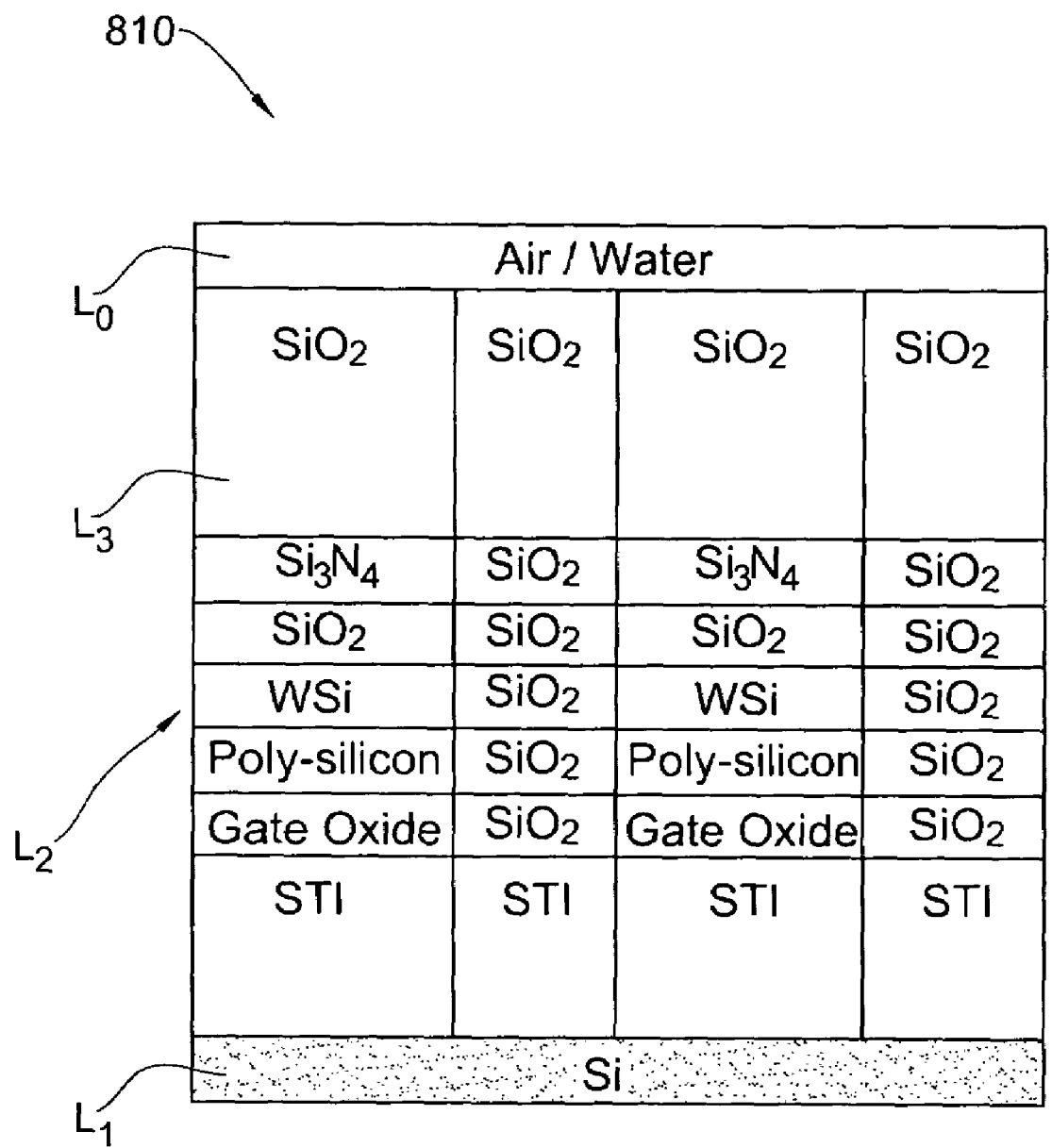

FIGS. 13A–13C illustrate a structure 810 of the typical DRAM application FIG. 13A is a top view of the structure. FIGS. 13B and 13C are cross-sectional views taken along lines A—A and B—B, respectively.

Lines $L^{(1)}$ correspond to the STI (Shallow Trench Isolation), i.e., lines of $SiO_2$ within a lower level $L_1$ of Si substrate, and lines $L^{(2)}$ correspond to the DRAM gate stack in the middle layer $L_2$ (SiN/Oxide/WSi/Poly/Gate Oxide stack). An upper layer $L_3$ of oxide is covered by an ambient air/water layer $L_0$.

In this case, the average permittivities $\epsilon_X(j)$ and $\epsilon_Y(j)$ of each layer for electric field vector being parallel to the X-axis and Y-axis, respectively, can be calculated. If the lines in the j-th layer are parallel to Y-axis, we have:

$$[\varepsilon_X(j)]^{-1} = \sum_{n=1}^{N} \sum_{m=1}^{M} [\varepsilon_{nm}(j)]^{-1} \frac{\Delta X_n \Delta Y_m}{\Lambda_X \Lambda_Y}$$

$$\varepsilon_X(j) = \sum_{n=1}^{N} \sum_{m=1}^{M} \varepsilon_{nm}(j) \frac{\Delta X_n \Delta Y_m}{\Lambda_X \Lambda_Y}$$

If the lines in the j-th layer area are parallel to the X-axis, we have:

$$\varepsilon_X(j) = \sum_{n=1}^{N} \sum_{m=1}^{M} \varepsilon_{nm}(j) \frac{\Delta X_n \Delta Y_m}{\Lambda_X \Lambda_Y}$$

-continued $$[\varepsilon_X(j)]^{-1} = \sum_{n=1}^{N}\sum_{m=1}^{M} [\varepsilon_{nm}(j)]^{-1} \frac{\Delta X_n \Delta Y_m}{\Lambda_X \Lambda_Y}$$

In the above equations, N is the number of stacks extending along the X-axis; M is the number of stacks extending along the Y-axis; $\Delta X_n$ is the width of the n-th stack along the X-axis; $\Delta Y_m$ is the width of the m-th stack along the Y-axis; $\varepsilon_{nm}(j)$ is the permittivity of a cell in the j-th layer, the cell belonging to the n-th stack along the X-axis and the m-th stack along the Y-axis; $\Lambda_X$ and $\Lambda_Y$ are the pitches along the X-axis and Y-axis, respectively.

The structure pitches $\Lambda_y$ and $\Lambda_x$ are determined as follows:

$$\Lambda y = \sum_{m=1}^{M} \Delta Y_m$$

For the specific example of FIGS. 13A–13B, we have:

N=2; M=2; $\Delta X_1$=0.3 nm; $\Delta X_2$=0.2 nm; $\Delta Y_1$=0.1 nm; $\Delta Y_2$=0.1 nm; $\Lambda X=\Delta X_1+\Delta X_2$=0.5 nm; $\Lambda Y=\Delta Y_1+\Delta Y_2$=0.2 nm The total reflectivity $R_{TOT}$ has the following form:

$$R_{TOT} = \psi \left| \sum_{n=1}^{N}\sum_{m=1}^{M} R_X(0,n,m) \frac{\Delta X_n \Delta Y_m}{\Lambda_X \Lambda_Y} \right|^2 +$$

$$(1-\psi) \left| \sum_{n=1}^{N}\sum_{m=1}^{M} R_Y(0,n,m) \frac{\Delta X_n \Delta Y_m}{\Lambda_X \Lambda_Y} \right|^2$$

wherein $\psi$ describes the polarization of light, the condition $\psi=0$ corresponding to light polarized along Y-axis, the condition $\psi=1$ corresponding to light polarized along the X-axis, the condition $\psi=0.5$ corresponding to unpolarized light The reflectivity amplitudes $R_X(j,n,m)$ and $R_Y(j,n,m)$ from different two-dimensional stacks (n,m) can be calculated using the above equations, but with the permittivities $\varepsilon_X(j,n,m)$ and $\varepsilon_Y(j,n,m)$, wherein index j describes the layer, indices n and m describe those stacks along the X- and Y-axes to which the (n,m)-substack belongs. The permittivities $\varepsilon_X(j,n,m)$ and $\varepsilon_Y(j,n,m)$ are calculated as follows:

$\varepsilon_X(j,n,m)=\varepsilon_X(j)+\alpha(\lambda)[\varepsilon_{nm}(j)-\varepsilon_X(j)]$ $\varepsilon_Y(j,n,m)=\varepsilon_Y(j)+\alpha(\lambda)[\varepsilon_{nm}(j)-\varepsilon_Y(j)]$ The measurements can be further opted by selecting an optical model that takes into account the relation between the wavelength $\lambda$ of incident light and the space size between two locally adjacent metal lines of the patterned structure (i.e., the width $W_2$ of the stack 12B in the example of FIGS. 1A and 1B or the width $W_2$ of the stack 712B in the example of FIG. 12). The model described below with reference to FIG. 14 keeps to be valid for both the case of $W_2>\lambda$ and the case of $W_2\sim\lambda$ (e.g., $0.5\lambda<\Delta X_1<\infty$).

Figure 14:
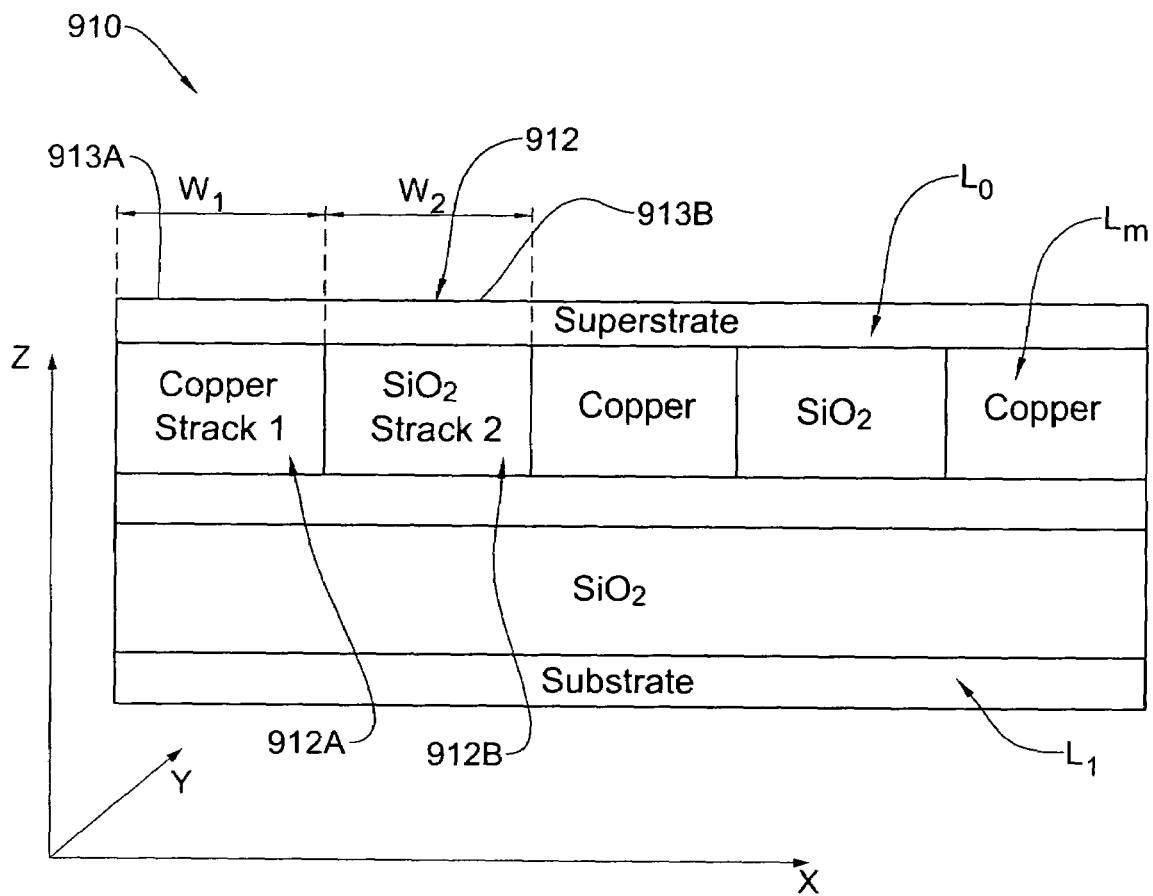
FIG. 14 illustrates a patterned structure for use in yet another example of the present invention

A patterned structure 910 shown in FIG. 14 is generally similar to the structure 710 of FIG. 12. The structure 910 formed on the substrate layer $L_1$ is composed of a plurality of cells (grid cycles) 912 (formed, for example, of straight lines of metal in a dielectric matrix), and is covered by the upper, ambient, "superstrate" layer $L_0$.

In the present example, the normal incidence of light onto the patterned structure 910 (e.g., straight lines of metal in dielectric matrix) is considered. Here, the Z-axis is perpendicular to the surge of the sire (i.e., parallel to the direction of propagation of incident light towards the structure), the X-axis is perpendicular to the lines of metal (i.e., elements of the pattern), and the Y-axis is parallel to the metal lines. A layer $L_m$ is the opaque regions containing layer and consists of opaque regions (lines) 913A and transparent regions 913B. In the present example, the opaque lines are metal lines (copper, tungsten, aluminum, etc.), the transparent lines are oxide lines (or low-k dielectric materials). Each transparent oxide line in the layer $L_m$ is surrounded by the opaque metal lines (Cu lines), and therefore forms a waveguide. The eigen function E(x,y,z) representing the electric field distribution within a wave-guide (electric field vector being parallel to the lines) has the form:

$$E(x,y,z) = \psi(x)\left[A\exp\left(+i\frac{2\pi}{\lambda}n_{eff}z\right)\exp\left(-\frac{2\pi}{\lambda}k_{eff}z\right) + \right.$$

$$\left. B\exp\left(-i\frac{2\pi}{\lambda}n_{eff}z\right)\exp\left(+\frac{2\pi}{\lambda}k_{eff}z\right)\right]$$

wherein $\psi(x)$ has the sinus-like shape within the oxide lines and decreases rapidly (on the scale of the metal skin depth $\delta$) within the metal lines; $n_{eff}(\lambda)$ is the effective refractive index $n_{eff}(\lambda)$; and $k_{eff}(\lambda)$ is the effective extinction coefficient.

The effective refractive index $n_{eff}(\lambda)$ and effective extinction coefficient $k_{eff}(\lambda)$ for the main mode have the form:

$$n_{eff}(\lambda) + ik_{eff}(\lambda) = \sqrt{(n_{Oxide}(\lambda) + ik_{Oxide}(\lambda))^2 - \left(\frac{\lambda}{2(W_2+2\delta(\lambda))}\right)^2}$$

wherein $n_{Oxide}(\lambda)$ and $k_{Oxide}(\lambda)$ are the refraction index and extinction coefficient, respectively, of the transparent lines (oxide in the present example), and $\delta(\lambda)$ is a metal skin depth.

The skin depth $\delta(\lambda)$ depends on the wavelength, but in the first approximation it can be kept constant for the given wavelength range. In the present example, $\delta$ is equal to the copper skin depth $\delta_{Cu}$. Parameter $\delta$ should be optimized for each metal (copper, tungsten, aluminum, etc.) and a specific application, because the optical properties of the metal lines depend on their composition and preparation. For example, the skin depth for the electroplated copper metal can be slightly different from that of the PVD deposited copper seed layer. The value of $\delta$ also depends on the wavelength range. The calculation technique of the present invention is applicable for Al and W lines as well, by using the corresponding value of $\delta$ ($\delta_{Al}$ for aluminum or $\delta_W$ for tungsten).

According to this model, where the lines 613B of transparent material are surrounded by the opaque (metal) lines 613A (layer $L_m$) the effective optical constants $n_{eff}(\lambda)$ and $k_{eff}(\lambda)$ are utilized, rather than the optical constants of the transparent material ($n_{Oxide}$ and $k_{Oxide}$ in the present example).

The present example utilizes the previously described calculation techniques but using the effective optical constants in the stack 712B for layers $L_m$ with metal lines satisfying the following condition:

$$\epsilon_2(J) = (n_{eff}(\lambda) + ik_{eff}(\lambda))^2$$

wherein J is a number of transparent layer in the stack 712B, which is surrounded by the metal lines.

Tuning back to the previously described approach, the reflectivity amplitude $r_1 = R_1(0)$ from the stack 712A and $r_2 = R_2(0)$ from the stack 712B were obtained using the following recurrent expressions:

$$R_1(j) = \frac{\chi_1(j) + R_1(j+1)\exp[-2i\sigma_1(j+1)]}{1 + \chi_1(j)R_1(j+1)\exp[-2i\sigma_1(j+1)]} \text{ for } j = K, K-1, \ldots, 1, 0.$$

$$R_2(j) = \frac{\chi_2(j) + R_2(j+1)\exp[-2i\sigma_2(j+1)]}{1 + \chi_2(j)R_2(j+1)\exp[-2i\sigma_2(j+1)]} \text{ for } j = K, K-1, \ldots, 1, 0.$$

$$\chi_1(j) = \frac{\sqrt{\varepsilon_1(j)} - \sqrt{\varepsilon_1(j+1)}}{\sqrt{\varepsilon_1(j)} - \sqrt{\varepsilon_1(j+1)}} \quad \chi_2(j) = \frac{\sqrt{\varepsilon_2(j)} - \sqrt{\varepsilon_2(j+1)}}{\sqrt{\varepsilon_2(j)} - \sqrt{\varepsilon_2(j+1)}}$$

$$\sigma_1(j) = \frac{2\pi}{\lambda} d_1(j)\sqrt{\varepsilon_2(j)} \quad \sigma_2(j) = \frac{2\pi}{\lambda} d_2(j)\sqrt{\varepsilon_2(j)}$$

These can be used in the above equation for $R_{TOT}$:

$$R_{TOT} = \{|r_1 \cdot A_{1P} + r_2 \cdot A_{2P}|^2 + |r_1 \cdot A_{1S} + r_2 \cdot A_{2S}|^2\} \cdot \frac{\gamma}{2} +$$

$$\{|r_1|^2 \cdot A_{1P}^2 + |r_2|^2 \cdot A_{2P}^2 + |r_1|^2 \cdot A_{1S}^2 + |r_2|^2 \cdot A_{2S}^2\} \cdot \frac{1-\gamma}{2}$$

constituting the theoretical data obtained by this optical model.

The above-described approach is based on the reflectivity amplitudes $X_1(j)$ and $X_2(j)$ that do not take into account the interference of the waves reflected from different layers. They described the reflectivity from the interface between the j-th and (+1)-th substances only. In other words, the reflectivity amplitudes used in the previously described models correspond to the reflectivity from the interface of two semi-infinite volumes with the permittivities $\epsilon_1(j)$ and $\epsilon_1(j+1)$ for the stack 712A, and $\epsilon_2(j)$ and $\epsilon_2(j+1)$ for the stack 712B.

In the present example, the reflectivity amplitudes $R_1(j)$ and $R_2(j)$ describe the reflectivity from the (j+1)-th layer with taking into account the effect of interference between the waves reflected from interfaces between the different layers. Thus, $R_1(0)$ and $R_2(0)$ correspond to the reflectivity from the upper layer of the measured structure for stacks 912A and 912B, respectively.

The complex coefficients $\sigma_1(j)$ and $\sigma_2(j)$ show both the attenuation and the phase shift of light within the j-th layer of stacks 712A and 712B. While the real part of the coefficient σ describes the phase shift, the imaginary part thereof describes the attenuation coefficient.

Index j=0 corresponds to the superstrate, and index j=K+1 corresponds to the substrate:

$$R_1(K+1) = 0 \quad R_2(K+1) = 0$$

$$\sigma_1(K+1) = 0 \quad \sigma_2(K+1) = 0$$

$$\epsilon_1(0) = \epsilon_{SUPERSTRATE} \quad \epsilon_2(0) = \epsilon_{SUPERSTRATE}$$

$$\epsilon_1(K+1) = \epsilon_{SUBSTRATE} \quad \epsilon_2(K+1) = \epsilon_{SUBSTRATE}$$

Thus, by taking into account the relation between the wavelength of incident light and the structure geometry (pitch or space size between the opaque lines), the mostly preferred optical model can be selected accordingly and applied to carry out measurerments of the structure parameters.

Those skilled in the art will readily appreciate that many modifications and changes may be applied to the invention as hereinbefore exemplified without departing from its scope defined in and by the appended claims. For example, the patterned structure nay comprise any number of cells, each cell being formed of any number of stacks. In the method claims that follow, characters, which are used to designate claim steps, are provided for convenience only and do not apply any particular order of performing the steps.

The invention claimed is:

1. A method of optical measurements on a patterned structure having an array of spaced-apart regions of different optical properties and having an uppermost layer of substantially uniform optical properties, the method comprising the steps of:
    a) providing an optical model, based on features of the structure, defined by a certain process of the structure manufacture, the optical model being configured for determining theoretical data representative of spectral characteristics of light returned from the structure and for calculating a thickness parameter of at least the uppermost layer of the structure;
    b) applying optical measurements to said structure, by illuminating it with incident radiation of a preset substantially wide wavelength range, detecting light returned from the structure, and obtaining measured data representative of spectral characteristics of the measured returned light within said wavelength range;
    c) processing and analyzing the measured data using said theoretical data, to determine a thickness of the uppermost layer of the structure under measurements in at least one region of the structure.

2. The method according to claim 1, wherein the uppermost layer is substantially transparent with respect to the incident light.

3. The method according to claim 1, wherein the regions of the different optical properties are defined by, respectively, substantially single-layer and multi-layer stacks, respectively.

4. The method according to claim 1, wherein said processing and analyzing comprises determining a relation between the measured data from the regions of the different optical properties.

5. The method according to claim 4, wherein said relation is indicative of the thickness of the uppermost layer substantially transparent with respect to the incident light.

6. The method according to claim 1, wherein said model is selected to have the uppermost layer thickness as a variable model parameter.

7. The method according to claim 1, wherein said structure is a semiconductor wafer structure, the regions of the different optical properties being defined by single-layer and multi-layer stacks, respectively.

8. The method according to claim 7, wherein said measured data is indicative of the thickness of the uppermost insulating silicon oxide layer.

9. The method according to claim 8, wherein said measured data is indicative of the thickness of the uppermost insulating silicon oxide layer within the space between the multi-layer regions.

10. The method according to claim 8, wherein said measured data is indicative of the thickness of the uppermost insulating silicon oxide layer within the multi-layer stack region.

11. The method according to claim 8, wherein the optical model comprises features defined prior to the measurements.

12. The method according to claim 8, wherein the features of the structure, on which the optical model is based, comprise nominal values of the thickness parameters to be measured.

13. The method according to claim 8, wherein said processing and analyzing comprises:
comparing the theoretical data with the measured data and providing data indicative of the relation between the measured and theoretical data.

14. The method according to claim 8, wherein the optical measurements are applied to a test site representing a test pattern similar to that of the structure under measurements in design rules and layer stacks.

15. The method according to claim 8, wherein the uppermost layer is a layer to be removed during the manufacturing process.

16. The method according to claim 8, wherein said manufacturing process includes Chemical Mechanical Planarization (CMP).

17. The method according to claim 16, wherein the optical model comprises features defined prior to the measurements.

18. The method according to claim 16, wherein the features of the structure, on which the optical model is based, comprise nominal values of the thickness parameters to be measured.

19. The method according to claim 16, wherein the uppermost layer is a layer to be removed during the CMP.

20. The method of claim 8, utilizing a spectrometric measurement system integrated with a processing tools arrangement carrying out the manufacturing process.

21. The method of claim 8, for controlling the manufacturing process applied to the structure.

22. The method of claim 8, for controlling the manufacturing process applied to the structure using an integrated spectrometric measurement system.

23. The method of claim 16, for controlling the CMP process applied to the structure.

24. The method of claim 23, utilizing a spectrometric measurement system integrated with the CMP tools arrangement.

25. The method according to claim 8, wherein said processing and analyzing comprises:
comparing the theoretical data with the measured data and providing data indicative of the relation between the measured and theoretical data.

26. The method according to claim 8, wherein the optical measurements are applied to a test site representing a test pattern similar to that of the structure under measurements in design rules and layer stacks.

27. The method according to claim 8, wherein the uppermost layer is a layer to be removed during the manufacturing process.

28. The method of claim 8, utilizing a spectrometric measurement system integrated with a processing tools arrangement carrying out the manufacturing process.

29. The method of claim 8, for controlling the manufacturing process applied to the structure.

30. The method of claim 8, for controlling the manufacturing process applied to the structure using an integrated spectrometric measurement system.

31. The method of claim 8, for controlling the CMP process applied to the structure.

32. The method of claim 31, utilizing a spectrometric measurement system integrated with the CMP tools arrangement.

33. The method according to claim 1, wherein the optical model comprises features defined prior to the measurements.

34. The method according to claim 1, wherein the features of the structure, on which the optical model is based, comprise nominal values of the thickness parameters to be measured.

35. The method according to claim 1, wherein said processing and analyzing comprises:
comparing the theoretical data with the measured data and providing data indicative of the relation between the measured and theoretical data.

36. The method according to claim 1, wherein the optical measurements are applied to a test site representing a test pattern similar to that of the structure under measurements in design rules and layer stacks.

37. The method according to claim 1, wherein the uppermost layer is a layer to be removed during the manufacturing process.

38. The method according to claim 1, wherein said manufacturing process includes Chemical Mechanical Planarization (CMP).

39. The method according to claim 38, wherein the uppermost layer is a layer to be removed during the CMP.

40. The method of claim 38, for controlling the CMP process applied to the structure.

41. The method of claim 38, utilizing a spectrometric measurement system integrated with the CMP tools arrangement.

42. The method of claim 1, utilizing a spectrometric measurement system integrated with a processing tools arrangement carrying out the manufacturing process.

43. The method of claim 1, for controlling the manufacturing process applied to the structure.

44. The method of claim 1, for controlling the manufacturing process applied to the structure using an integrated spectrometric measurement system.

45. An apparatus for optical measuring in a patterned structure having an array of spaced-apart regions of different optical properties and having an uppermost layer of substantially uniform optical properties, the apparatus comprising:
a spectrometer for detecting a light response of the structure to incident light of a preset substantially wide wavelength range and for providing measured data representative of spectral characteristics of said light response within said wavelength range; and
a processor unit coupled to the spectrometer, the processor being operable for applying an optical model based on features of the structure, defined by a certain process of the structure manufacture, to determining theoretical data representative of spectral characteristics of light returned from the structure and for calculating a thickness parameter of at least the uppermost layer of the structure, and
processing and analyzing said measured using the theoretical data and determining a thickness of the uppermost layer of the structure under measurements in at least one region of the structure.

46. The apparatus according to claim 45, wherein said spectrometer comprises a spectrometric detector and a variable aperture stop located in the optical path of light reaching the detector, the diameter of the aperture stop being variable in accordance with the pattern in the structure under measurements.

47. The apparatus according to claim 45, wherein said the processor unit comprising a pattern recognition software for locating the measurements.

* * * * *